US007834827B2

(12) United States Patent
Miyake et al.

(10) Patent No.: US 7,834,827 B2
(45) Date of Patent: Nov. 16, 2010

(54) LIGHT EMITTING DEVICE AND DRIVING METHOD THEREOF

(75) Inventors: Hiroyuki Miyake, Kanagawa (JP); Ryota Fukumoto, Kanagawa (JP); Tomoyuki Iwabuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1511 days.

(21) Appl. No.: 11/190,777

(22) Filed: Jul. 27, 2005

(65) Prior Publication Data
US 2006/0022900 A1 Feb. 2, 2006

(30) Foreign Application Priority Data
Jul. 30, 2004 (JP) .............. 2004-223024

(51) Int. Cl.
*G09G 3/32* (2006.01)
(52) U.S. Cl. .............. 345/82; 345/83; 345/204; 345/211
(58) Field of Classification Search ......... 345/82–83, 345/204, 211
See application file for complete search history.

(56) References Cited

U.S. PATENT DOCUMENTS

| 5,552,678 A * | 9/1996 | Tang et al. ........... 315/169.3 |
| 6,380,689 B1 | 4/2002 | Okuda |
| 6,524,877 B1 * | 2/2003 | Nakazawa et al. ........... 438/48 |
| 7,283,108 B2 * | 10/2007 | Kasai ........... 345/76 |
| 2002/0101179 A1 * | 8/2002 | Kawashima ........... 315/169.3 |
| 2002/0195968 A1 * | 12/2002 | Sanford et al. ........... 315/169.3 |
| 2003/0052614 A1 * | 3/2003 | Howard ........... 315/169.1 |
| 2003/0222592 A1 * | 12/2003 | Tsai et al. ........... 315/169.2 |
| 2004/0160167 A1 | 8/2004 | Arai et al. |
| 2004/0179005 A1 * | 9/2004 | Jo ........... 345/211 |
| 2005/0062692 A1 * | 3/2005 | Lo et al. ........... 345/76 |
| 2005/0068271 A1 * | 3/2005 | Lo ........... 345/76 |
| 2005/0110420 A1 * | 5/2005 | Arnold et al. ........... 315/169.3 |
| 2008/0138943 A1 * | 6/2008 | Kato et al. ........... 438/164 |

FOREIGN PATENT DOCUMENTS

JP 2001-109432 4/2001
JP 2004-031335 1/2004

* cited by examiner

*Primary Examiner*—Richard Hjerpe
*Assistant Examiner*—Leonid Shapiro
(74) *Attorney, Agent, or Firm*—Husch Blackwell LLP Welsh Katz

(57) ABSTRACT

According to a driving method of applying a reverse bias voltage, capacitance occurs due to a stacked structure of a conductor, an insulator and a conductor, or due to a structure of a TFT. This capacitance prevents normal operation. The invention provides a pixel configuration including at least a driving transistor for driving a light emitting element and a switching transistor for controlling the driving transistor, wherein the switching transistor is turned on in the case of applying a forward bias voltage after applying a reverse bias voltage. As a result, it is prevented that the potential changes due to unwanted capacitive coupling.

10 Claims, 19 Drawing Sheets

FORWARD BIAS VOLTAGE APPLYING PERIOD

REVERSE BIAS VOLTAGE APPLYING PERIOD

LIGHT EMITTING DEVICE AND DRIVING METHOD THEREOF

BACKGROUND OF THE INVENTION

1. Field of the Invention

The present invention relates to a light emitting device to which a reverse bias voltage is applied, and a driving method thereof.

2. Description of the Related Art

It is known that a light emitting element can operate for a longer time if being applied with a reverse bias voltage that does not cause light emission. By utilizing this phenomenon, suggested is a light emitting device adopting an active matrix driving method where a reverse bias voltage is applied during a non-lighting period in synchronism with input video data (see Patent Document 1).

In addition, a defect can be corrected by applying a reverse bias voltage. For example, there is suggested a method of completely correcting a defect by applying a reverse bias voltage to a light emitting element without through a TFT (see Patent Document 2). [Patent Document 1] Japanese Patent Laid-Open No. 2001-109432 [Patent Document 2] Japanese Patent Laid-Open No. 2004-31335

SUMMARY OF THE INVENTION

According to a driving method of applying a reverse bias voltage is applied, however, capacitance occurs due to a stacked structure of a conductor, an insulator and a conductor, or due to a structure of a TFT. This capacitance prevents normal operation of a light emitting device, that is, a light emitting element slightly emits light during a non-lighting period (this phenomenon is referred to as black float).

In view of the foregoing, the invention provides a driving method of applying a reverse bias voltage correctly, and a light emitting device for achieving the driving method.

To solve the aforementioned problem, the invention provides a pixel configuration having at least a first transistor (also referred to as a driving transistor) for driving a light emitting element and a second transistor (also referred to as a switching transistor) for controlling the first transistor, wherein the switching transistor is turned on in the case of applying a reverse bias voltage, thereby a gate electrode of the driving transistor can be brought into an electrically non-floating state. When a reverse bias voltage is applied to the light emitting element, the driving transistor is turned on. Meanwhile, when a forward bias voltage is applied, a signal for turning off the driving transistor (non-lighting signal) so that the light emitting element emits no light is inputted to the switching transistor that is on. Accordingly, black float where the light emitting element emits light during a non-lighting period can be prevented.

Configurations of the invention are specifically described below.

According to one mode of the invention, a light emitting device includes a light emitting element, a first transistor for driving the light emitting element, a second transistor for controlling the first transistor, a unit for bringing a gate electrode of the first transistor into an electrically non-floating state in the case of applying a forward bias voltage after applying a reverse bias voltage, and a unit for determining the potential of the gate electrode of the first transistor so that the light emitting element emits no light.

The unit for bringing the gate electrode of the first transistor into an electrically non-floating state in the case of applying a forward bias voltage after applying a reverse bias voltage corresponds to a state where the second transistor is on.

The unit for determining the potential of the gate electrode of the first transistor so that the light emitting element emits no light corresponds to a state where a signal is inputted to a signal line so that the light emitting element emits no light when the second transistor is on.

A driving method of the invention is specifically described below.

According to one mode of the invention, a driving method of a light emitting device including a light emitting element, a first transistor for driving the light emitting element, and a second transistor for controlling the first transistor, includes the steps of bringing a gate electrode of the first transistor into an electrically non-floating state in the case of applying a forward bias voltage to the light emitting element after applying a reverse bias voltage thereto, and determining the potential of the gate electrode of the first transistor so that the light emitting element emits no light.

According to the invention, the gate electrode of the driving transistor can be brought into an electrically non-floating state; therefore, correct operation is achieved. Consequently, a reverse bias voltage can be applied to the light emitting element, leading to longer life of the light emitting element.

DETAILED DESCRIPTION OF THE INVENTION

Figure 1:
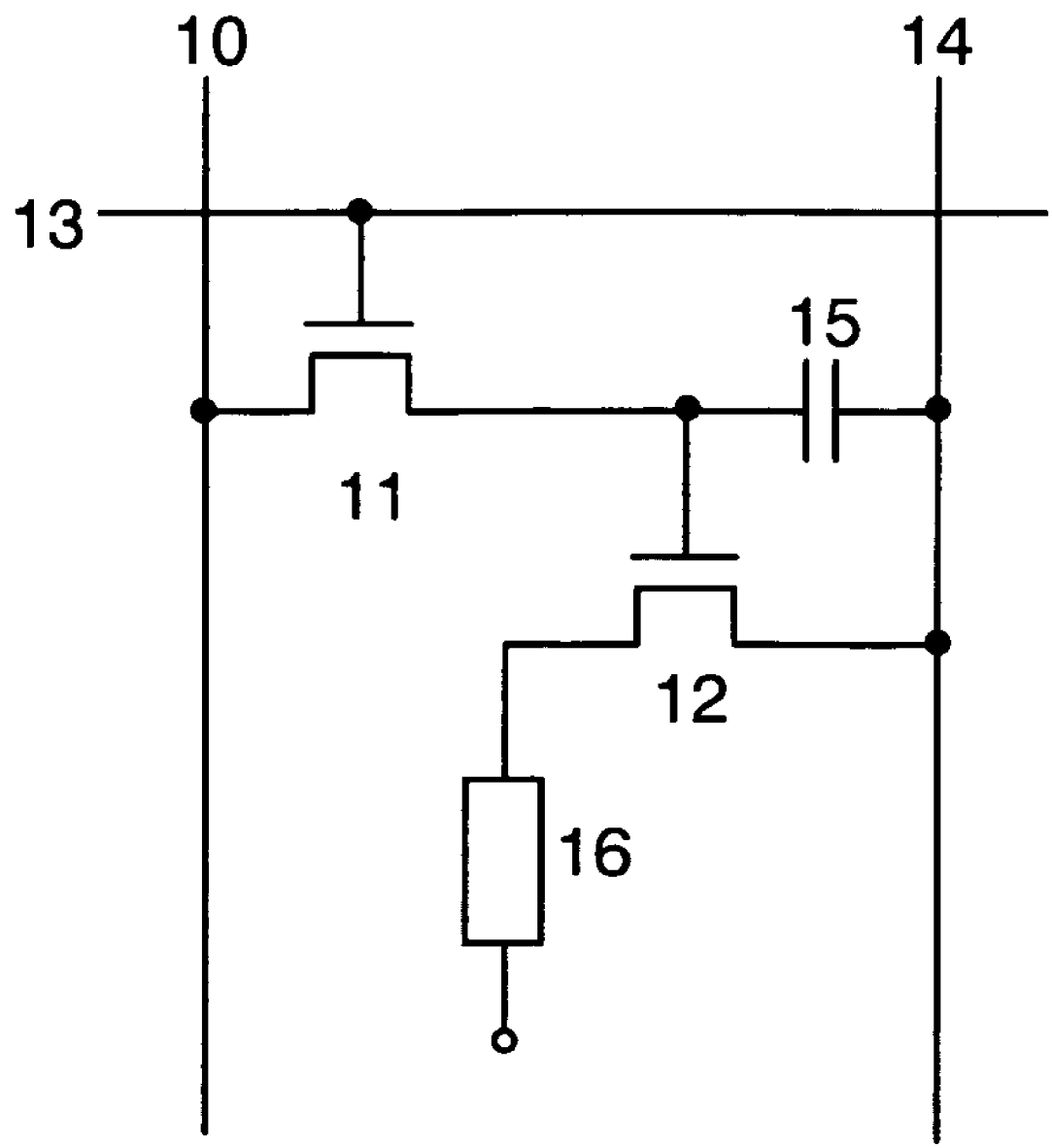
FIG. 1 is a diagram showing a pixel circuit of the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. Note that in all the drawings for describing Embodiment Modes, the same portion or a portion having the same function is denoted by the same reference numeral, and description thereof is omitted.

Embodiment Mode 1

In this embodiment mode, a pixel configuration and a driving method thereof are described.

FIG. 1 shows a pixel configuration having a signal line 10, a switching transistor 11, a driving transistor 12, a scan line 13, a power supply line 14, a capacitor 15, and a light emitting element 16. A pixel area is constituted by a plurality of such pixels.

Connection in this pixel is described. The switching transistor 11 is provided at an intersection of the signal line 10 and the scan line 13. One electrode of the switching transistor 11 is connected to the signal line 10 while a gate electrode thereof is connected to the scan line 13. One electrode of the driving transistor 12 is connected to the power supply line 14 while a gate electrode thereof is connected to the other electrode of the switching transistor 11. The capacitor 15 is provided to hold a gate-source voltage of the driving transistor 12. In this embodiment mode, one electrode of the capacitor 15 is connected to the power supply line 14 while the other electrode thereof is connected to the gate electrode of the driving transistor 12. Note that the capacitor 15 is not necessarily provided when, for example, the driving transistor 12 has large gate capacitance and small leak current. The light emitting element 16 is connected to the other electrode of the driving transistor 12.

A driving method of such a pixel is described.

When the switching transistor 11 is turned on, a video signal is inputted from the signal line 10. Charges are accumulated in the capacitor 15 in accordance with the video signal. When the charges accumulated in the capacitor 15 exceed a gate-source voltage (Vgs) of the driving transistor 12, the driving transistor 12 is turned on. Then, a current is supplied to the light emitting element 16 to emit light. At this time, the driving transistor 12 can operate in either the linear region or the saturation region. If operating in the saturation region, the driving transistor 12 can supply a constant current. Meanwhile, if operating in the linear region, the driving transistor 12 can be driven at a low voltage, leading to low power consumption.

The driving method of the pixel is described with reference to timing charts.

Figure 4A:
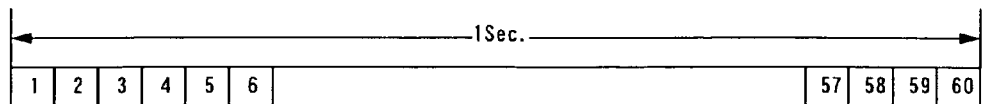
FIGS. 4A to 4E are diagrams showing a driving method of the invention.
Figure 4B:
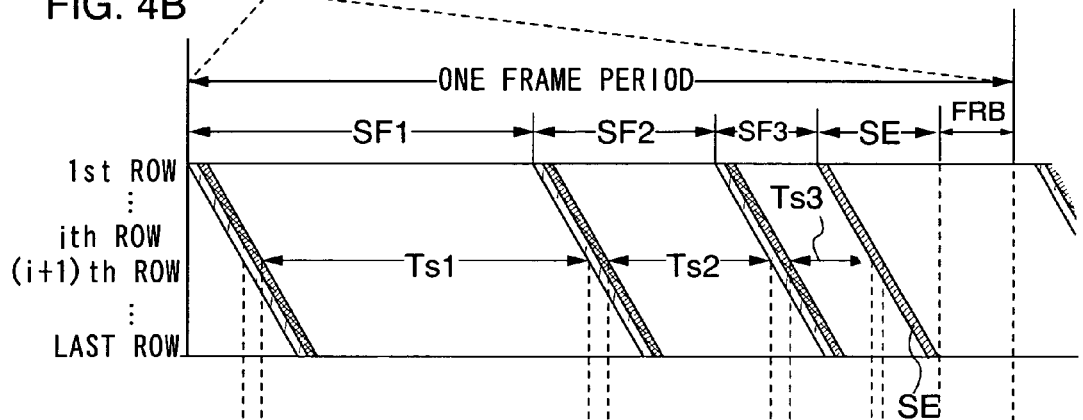

FIGS. 4A and 4B are timing charts of one frame period in the case of writing an image 60 times per second. The ordinate represents a scan line G (from the first to the last row) whereas the abscissa represents time.

One frame period includes m (m is a natural number of 2 or more) subframe periods SF1, SF2, . . . , SFm, each of which includes writing periods Ta1, Ta2, . . . , Tam and display periods (lighting periods) Ts1, Ts2, . . . , Tsm respectively. One frame period also includes a reverse bias voltage applying period. In this embodiment mode, as shown in FIG. 4B, one frame period includes subframe periods SF1, SF2 and SF3, and a reverse bias voltage applying period (FRB). In the subframe periods SF1, SF2 and SF3, the writing periods Ta1 to Ta3 are performed, followed by the display periods Ts1 to Ts3 respectively.

Figure 4C:
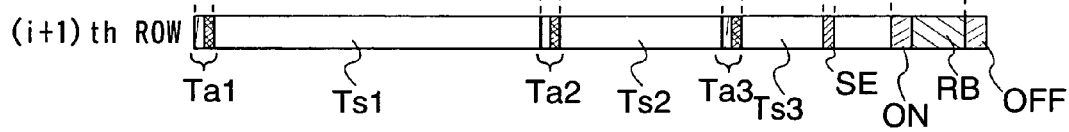

A timing chart of FIG. 4C shows a writing period, a display period and a reverse bias voltage applying period of a certain row (i-th row). A reverse bias voltage applying period appears after a writing period and a display period alternately appear. A period having the writing period and the display period is referred to as a forward bias voltage applying period.

Figure 5A:
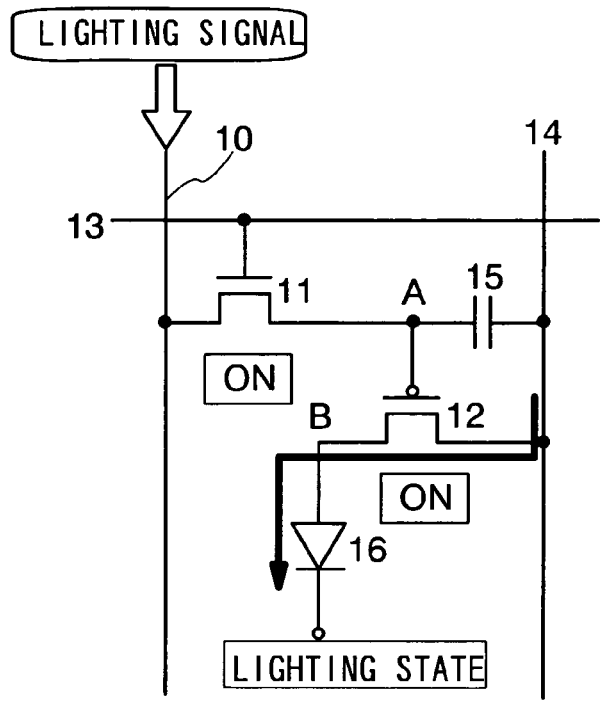
FIGS. 5A and 5B are diagrams each showing a pixel circuit of the invention.

During a forward bias voltage applying period, as shown in FIG. 5A, the switching transistor 11 is turned on and a signal (lighting signal) is inputted from the signal line 10 so that the light emitting element 16 emits light. Then, the driving transistor 12 is turned on, a current is supplied from the power supply line 14, and the light emitting element 16 emits light.

A reverse bias voltage applying period includes a period when the switching transistors 11 of all the pixels are simultaneously turned on, that is, all the scan lines are turned on (ON period), and a period when a reverse bias voltage is applied (applying period). Note that during the reverse bias voltage applying period, a WE signal is inputted and the light emitting element emits no light.

After the reverse bias voltage applying period, the switching transistors 11 of all the pixels are simultaneously turned off, that is, all the scan lines are turned off (OFF period). In this embodiment mode, the forward bias voltage applying period includes the OFF period.

Figure 5B:
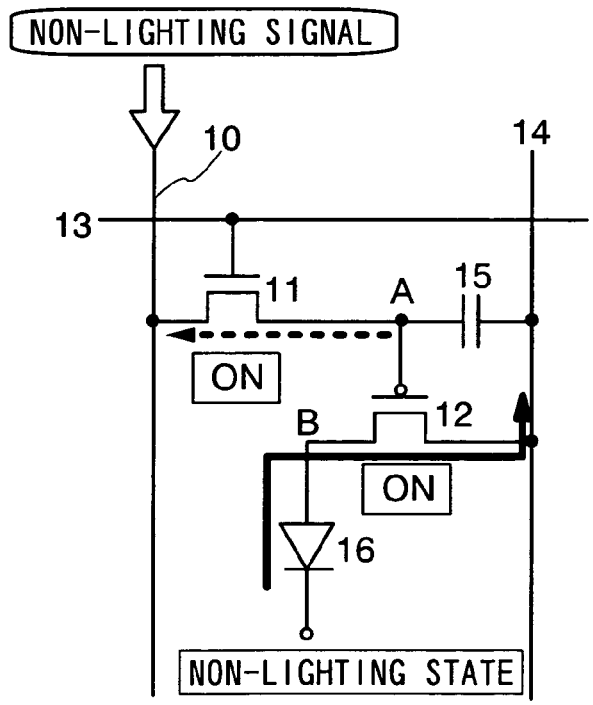

According to the invention, during the ON period included in the reverse bias voltage applying period, the switching transistor 11 is controlled to be turned on. Therefore, the gate electrode of the driving transistor 12 can be brought into an electrically non-floating state as shown in FIG. 5B. Specifically, when the switching transistor 11 is turned on, point A is brought into an electrically non-floating state. Accordingly, it is prevented that the potential at the point A changes due to unwanted capacitive coupling mainly between the point A and the point B when the reverse bias voltage applying period is transferred to the forward bias voltage applying period. As a result, the light emitting element can be prevented from emitting light due to unwanted capacitive coupling during the OFF period.

In the prior art, the switching transistor is turned off before and after the reverse bias voltage is applied. Therefore, the point A is brought into a floating state, and the potential at the point A changes due to unwanted capacitive coupling between the point A and point B, thereby the light emitting element may emit light.

Note that the light emitting element should be in a non-lighting state before and after the reverse bias voltage applying period as shown in FIG. 5B. Thus, a signal for bringing the light emitting element into the non-lighting state (referred to as a non-lighting signal) is inputted to the signal line 10 connected to the switching transistor 11. For example, a High signal is inputted if a P-channel transistor is used as the driving transistor 12, while a Low signal is inputted if an N-channel transistor is used as the driving transistor 12. These signals are inputted from a signal line driver circuit. Then, it is prevented that the potential at the point A changes due to unwanted capacitive coupling mainly between the point A and the point B before and after the reverse bias is applied. Consequently, black float can be prevented during the forward bias voltage applying period.

Subsequently, the switching transistor 11 is turned off during the OFF period, and the next frame period starts thereafter.

According to such a driving method, a reverse bias voltage can be applied while preventing the light emitting element from emitting light. As a result, accurate image display can be achieved and the light emitting element can operate for a longer time.

In addition, an erasing period (SE) is provided immediately before the reverse bias voltage applying period. During the erasing period, data that has been written during the subframe period immediately before the erasing period, namely during SF3 in this embodiment mode, is sequentially erased. This is because during the ON period, the switching transistors 11 are simultaneously turned on after the display period of the pixels of the last row is completed, and thus each pixel of the first row and the like has an unnecessary display period. The erasing period allows image display to be performed correctly.

Figure 4D:
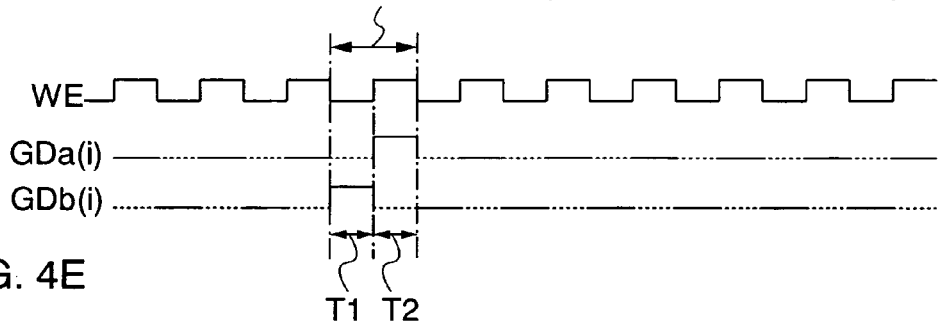

FIG. 4D shows a waveform of a signal inputted to the scan line 13. The WE signal is at L (Low) level during a period T1 while at H (High) level during a period T2. Note that the H level and the L level mean potentials with a relative difference. Each of the periods T1 and T2 corresponds to half of one gate selection period (one horizontal period), and the period T1 is also referred to as a first subgate period while the period T2 is also referred to as a second subgate period.

During the first subgate period, a signal (GDb) is inputted from a second scan line driver circuit to the scan line of the i-th row in synchronism with the WE signal. Meanwhile, during the second subgate period, a signal (GDa) is inputted from a first scan line driver circuit to the scan line of the i-th row in synchronism with the WE signal. When one gate selection period thus includes a plurality of subgate periods, a displaying video signal and an erasing video signal can be written from a signal line during each writing period. Accordingly, no erasing transistor is required to be provided, which results in high aperture ratio.

Figure 4E:
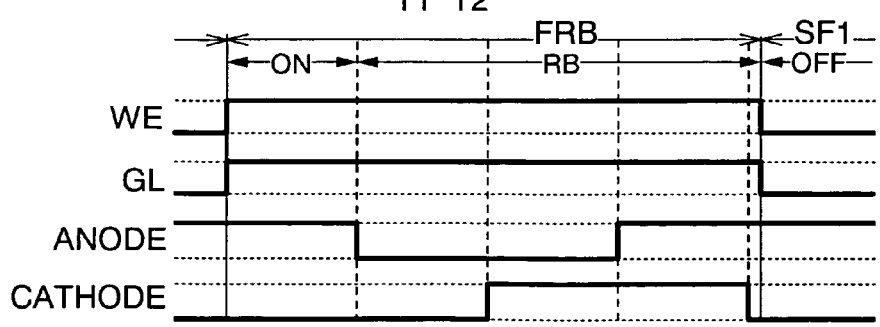

FIG. 4E shows the WE signal, a reverse bias voltage applying control signal (GL), and potentials of an anode (ANODE) and a cathode (CATHODE) during the reverse bias voltage applying period (FRB). During the reverse bias voltage applying period, first, the WE signal and the GL become H level during the ON period. Then, during the applying period (RB), the potential of the anode is inverted, that is, it becomes L level when the initial potential is at H level. Subsequently, the potential of the cathode is inverted, that is, it becomes H level when the potential of the anode is at L level. The potential of the anode returns to the initial value and the potential of the cathode returns to the initial value thereafter. When the potentials of the anode and the cathode are alternately inverted in this manner, a reverse bias voltage can be applied correctly. A reverse bias voltage is applied to the light emitting element during such an applying period. Then, the GL becomes L level during the OFF period.

Such a control is performed by a driver circuit such as a scan line driver circuit and a signal line driver circuit. In specific, the control is performed by a switch circuit provided in the scan line driver circuit or the signal line driver circuit.

Note that the timing of applying a reverse bias voltage to the light emitting element 16, namely the reverse bias voltage applying period is not limited to the one shown in FIGS. 4A to 4E. That is to say, the reverse bias voltage applying period is not necessarily provided for each frame period, nor in the latter part of one frame period. The ON period is only required to be provided immediately before the applying period (RB) and the OFF period is only required to be provided immediately after the applying period (RB). In addition, the order of inverting the potentials of the anode and the cathode of the light emitting element is not limited to the one shown in FIGS. 4A to 4E. That is, the potential of the anode may decrease after the potential of the cathode increases.

By applying a reverse bias voltage to the light emitting element, degradation of the light emitting element can be improved and reliability can be increased. In the light emitting element, an initial defect where an anode and a cathode are short-circuited may occur due to the deposition of foreign material, pinholes due to a slight unevenness of the anode or the cathode, and roughness of the electroluminescent layer. In a pixel having such an initial defect, light emission and non-light emission are not carried out in accordance with signals, and almost all currents flow through the short-circuited portion so that the pixel emits no light, which results in faulty display of images. Further, this short circuit may occur in any pixel. Thus, when a reverse bias voltage is applied to the light emitting element as described in this embodiment mode, a current is locally supplied only to the short-circuited portion, and the short-circuited portion generates heat. As a result, the short-circuited portion can be oxidized or carbonized to be insulated, and a current is supplied to an area other than the short-circuited portion, thereby the luminance corresponding to a signal can be obtained. Thus, even when an initial defect occurs, the defect can be corrected and images can be displayed with high quality by applying a reverse bias voltage. Note that such insulation of the short-circuited portion is preferably performed before shipment of a display device.

Not only the initial defect, but also another defect where the anode and the cathode are short-circuited may occur as time passes. Such a defect is also called a progressive defect. However, according to the invention, a reverse bias voltage can be applied to the light emitting element periodically. Therefore, even when the progressive defect occurs, the defect can be corrected and images can be displayed with high quality.

By applying a reverse bias voltage, image burn-in can also be prevented. The image burn-in is caused by degradation of the light emitting element 16; however, the degradation can be reduced by applying a reverse bias voltage. As a result, the image burn-in can be prevented.

In general, degradation of a light emitting element progresses rapidly in the initial stage and gradually slows down with time. That is to say, in a pixel, a light emitting element that has degraded in the initial stage does not degrade easily. Accordingly, all the pixels preferably emit light before shipment of a display device or during a period when no image is displayed, which causes degradation of a pixel that has not degraded and allows degradation of all the pixels to progress at the same rate. Such a configuration where all the pixels emit light during a period when no image is displayed may be adopted.

As set forth above, the light emitting element can operate for a longer life when being applied with a reverse bias voltage correctly. In addition, according to the invention, it is prevented that the potential changes due to unwanted capacitive coupling, therefore, the light emitting element can be prevented from emitting light during a reverse bias voltage applying period, leading to an accurate driving method of the light emitting element.

Embodiment Mode 2

In this embodiment mode, an entire panel having the aforementioned pixel is described.

Figure 11:
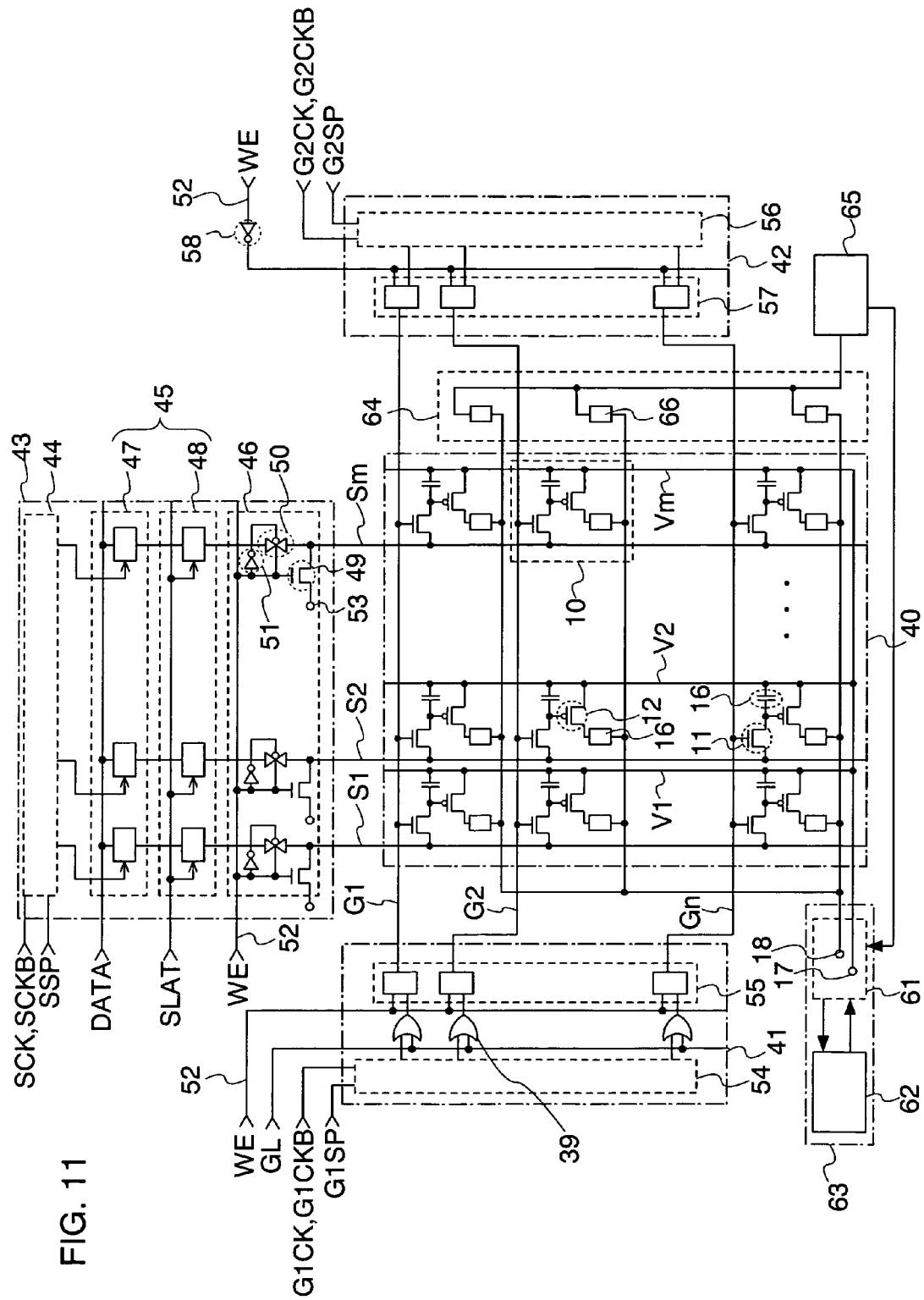
FIG. 11 is a diagram showing a panel of the invention.

As shown in FIG. 11, a light emitting device of the invention includes a pixel area 40 where a plurality of the aforementioned pixels are arranged in matrix, a first scan line driver circuit 41, a second scan line driver circuit 42, and a signal line driver circuit 43. The first scan line driver circuit 41 and the second scan line driver circuit 42 may be disposed so as to face each other with the pixel area 40 interposed therebetween, or may be disposed on one of the four sides of the pixel area 40.

The signal line driver circuit 43 includes a pulse output circuit 44, a latch 45 and a selection circuit 46. The latch 45 has a first latch 47 and a second latch 48. The selection circuit 46 has a transistor 49 (hereinafter referred to as a TFT 49) and an analog switch 50 as switching means. The TFT 49 and the analog switch 50 are provided in each column depending on a signal line. In addition, in this embodiment mode, an inverter 51 is provided in each column for generating an inverted signal of a WE signal. Note that the inverter 51 is not necessarily provided when an inverted signal of a WE signal is supplied externally. A gate electrode of the TFT 49 is connected to a selection signal line 52, and one electrode thereof is connected to a signal line while the other electrode is connected to a power supply 53. The analog switch 50 is provided between the second latch 48 and each signal line. In other words, an input node of the analog switch 50 is connected to the second latch 48 while an output node is connected to the signal line. One of two control nodes of the analog switch 50 is connected to the selection signal line 52 while the other is connected to the selection signal line 52 through the inverter 51. The power supply 53 has a potential that turns off the driving transistor 12 in each pixel, and the potential of the power supply 53 is at L level if an N-channel transistor is used as the driving transistor 12 while at H level if a P-channel transistor is used as the driving transistor 12. During a reverse bias voltage applying period, however, the power supply 53 has a potential that turns on the driving transistor 12, such that a reverse bias voltage is applied to the light emitting element.

The first scan line driver circuit 41 includes a pulse output circuit 54, a selection circuit 55, and an OR circuit 39 provided therebetween. The second scan line driver circuit 42 includes a pulse output circuit 56 and a selection circuit 57. Note that in the second scan line driver circuit 42, an OR circuit may be provided between the pulse output circuit 56 and the selection circuit 57, and a control signal (GL) may be inputted thereto. Start pulses (G1SP, S2SP) are inputted to the pulse output circuits 54 and 56 respectively. Clock pulses (G1CK, G2CK) and inverted clock pulses thereof (G1CKB, G2CKB) are also inputted to the pulse output circuits 54 and 56 respectively.

The selection circuits 55 and 57 are connected to the selection signal line 52, though the selection circuit 57 included in the second scan line driver circuit 42 is connected to the selection signal line 52 through an inverter 58. In other words, WE signals inputted to the selection circuits 55 and 57 through the selection signal line 52 are inverted from each other.

Each of the selection circuits 55 and 57 includes a tri-state buffer circuit. An input node of the respective tri-state buffer circuits is connected to the pulse output circuit 54 or the pulse output circuit 56. One of two control nodes of the tri-state buffer circuit is connected to the selection signal line 52 while the other is connected to an output node of the OR circuit 39. An output node of the tri-state buffer circuit is connected to a scan line. The tri-state buffer circuit is brought into an operating state when a signal transmitted from the selection signal line 52 is at H level and into a high impedance state when the signal is at L level.

One of two input nodes of the OR circuit 39 is connected to a terminal inputted with a control signal (GL), while the other is connected to the pulse output circuit 54. The OR circuit 39 and the control signal (GL), namely the first scan line driver circuit 41, allows the switching transistor 11 and the driving transistor 12 to be selected (turned on) during a reverse bias voltage applying period. Note that in this embodiment mode, an inverter and an AND circuit may be used instead of the OR circuit.

Each of the pulse output circuit 44 included in the signal line driver circuit 43, the pulse output circuit 54 included in the first scan line driver circuit 41, and the pulse output circuit 56 included in the second scan line driver circuit 42 includes a shift register having a plurality of flip flop circuits or a decoder circuit. If a decoder circuit is used as the pulse output circuits 44, 54 and 56, a signal line or a scan line can be selected at random. By selecting a signal line or a scan line at random, pseudo contour occurring when adopting a time gray scale method can be prevented.

The signal line driver circuit 43 allows a non-lighting signal to be inputted to the signal line Sm during a reverse bias voltage applying period.

The configuration of the signal line driver circuit 43 is not limited to the aforementioned one, and a level shifter or a buffer circuit may be provided additionally. The configuration of the first scan line driver circuit 41 and the second scan line driver circuit 42 is also not limited to the aforementioned one, and a level shifter or a buffer circuit may be provided additionally. Further, each of the signal line driver circuit 43, the first scan line driver circuit 41, and the second scan line driver circuit 42 may include a protection circuit.

Figure 12:
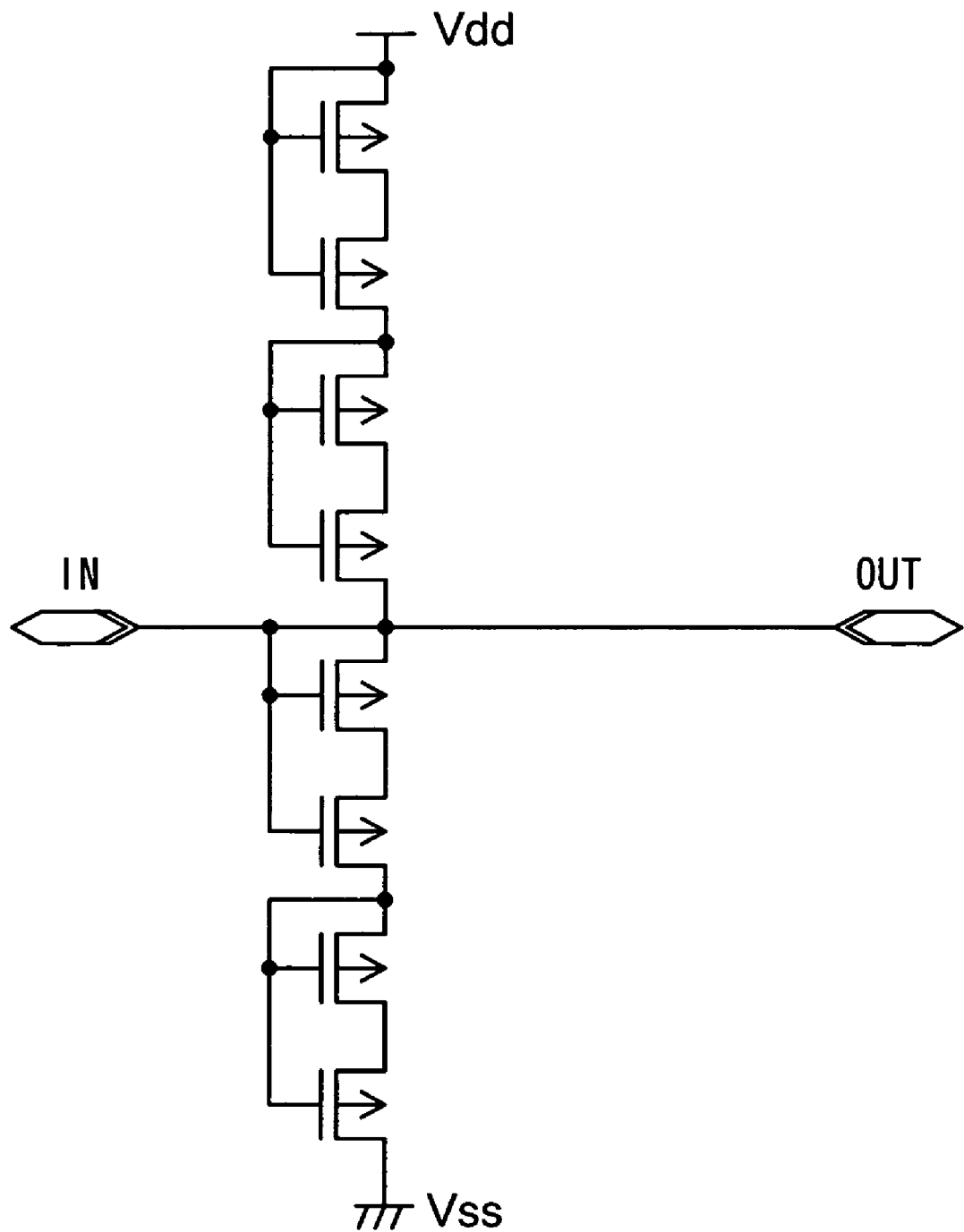
FIG. 12 is a diagram showing a protection circuit of the invention.

FIG. 12 shows a configuration example of a protection circuit. The protection circuit includes a plurality of resistors. In this embodiment mode, P-channel transistors are used as the plurality of resistors. The protection circuit may be provided in the signal line driver circuit 43, the first scan line driver circuit 41, or the second scan line driver circuit 42. Preferably, the protection circuit is provided between the pixel area 40 and the signal line driver circuit 43, the first scan line driver circuit 41, or the second scan line driver circuit 42. If the protection circuit is provided between the signal line driver circuit 43 and the pixel area 40, an input node of the protection circuit is connected to the signal line driver circuit while an output node thereof is connected to the signal line. Such a protection circuit prevents degradation or destruction of elements due to static electricity.

In this embodiment mode, the light emitting device includes a power supply control circuit 63 that has a power supply circuit 61 for supplying power to the light emitting element 16 and a controller 62. The power supply circuit 61 includes a first power supply 17 connected a pixel electrode of the light emitting element 16 through the driving transistor 12 and the power supply line Vm. The power supply circuit 61 also includes a second power supply 18 connected to the light emitting element 16 through a power supply line connected to a counter electrode.

When a forward bias voltage is applied to the light emitting element 16 so that the light emitting element 16 is supplied with a current and emits light, the potential of the first power supply 17 is set to be higher than that of the second power supply 18. On the other hand, when a reverse bias voltage is applied to the light emitting element 16, the potential of the first power supply 17 is set to be lower than that of the second power supply 18. Such a setting of the power supply can be performed by supplying a predetermined signal from the controller 62 to the power supply circuit 61. A reverse bias voltage can thus be applied to the light emitting element 16 by using the power supply control circuit 63, thereby degradation with time of the light emitting element 16 is suppressed and reliability is increased. Specifically, an initial defect where an anode and a cathode are short-circuited can be prevented from occurring in the light emitting element 16 due to the deposition of foreign material, pinholes due to a slight unevenness of the anode or the cathode, and roughness of an electroluminescent layer. In addition, a progressive defect where the anode and the cathode are short-circuited as time passes can also be prevented, thereby images can be displayed with high quality. Note that the timing of applying a reverse bias voltage to the light emitting element 16 is not particularly limited.

In this embodiment mode, the light emitting device also includes a monitor circuit 64 and a control circuit 65. The monitor circuit 64 operates in accordance with the surrounding temperature (hereinafter referred to as the ambient temperature). The control circuit 65 includes a constant current source and a buffer circuit. In FIG. 11, the monitor circuit 64 has a monitor element 66 for monitoring (hereinafter referred to as a monitor element).

The control circuit 65 supplies a signal for changing the power supply potential to the power supply control circuit 63 in accordance with an output of the monitor circuit 64. The power supply control circuit 63 changes a power supply potential supplied to the pixel area 40 depending on the signal supplied from the control circuit 65. According to the invention having the aforementioned configuration, variations in current values due to changes in the ambient temperature can be suppressed, leading to increased reliability. Note that the monitor circuit 64 and the control circuit 65 are described in more detail in the following embodiment mode.

Embodiment Mode 3

In this embodiment mode, a configuration of the first or second scan line driver circuit is described. It should be noted that the configuration of the second scan line driver circuit 42 is the same as that of the first scan line driver circuit 41; therefore, the description thereof is omitted.

Figure 13:
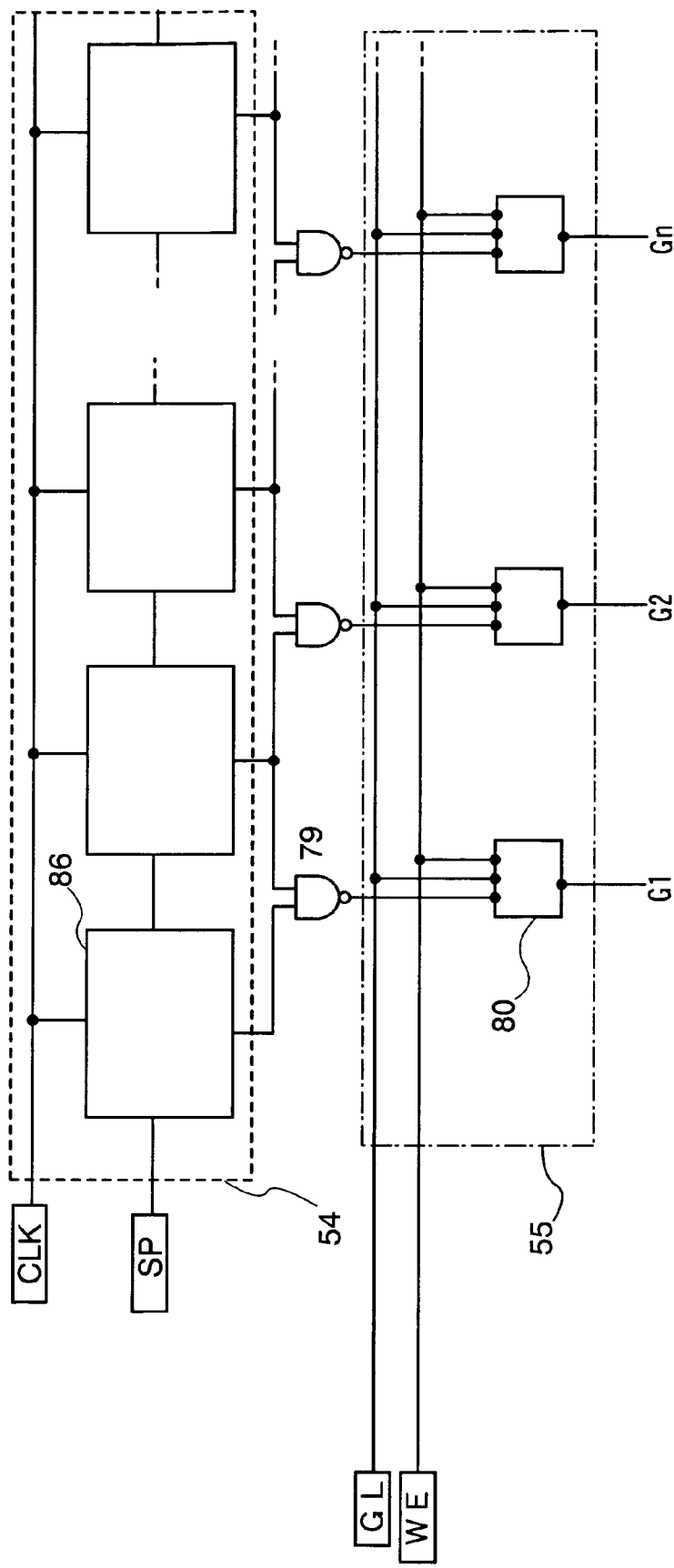
FIG. 13 is a diagram showing a driver circuit of the invention.

As shown in FIG. 13, the first scan line driver circuit 41 has the pulse output circuit 54, a level shifter (GLS) 86, and the selection circuit 55.

Clock signals (GCK, GCKB), and a start pulse (GSP) are inputted to the pulse output circuit 54. A signal generated from these pulse signals is inputted to the selection circuit 55 through a NAND circuit 79.

The selection circuit 55 can include a buffer circuit 80, a tri-state buffer circuit, and a protection circuit.

Figure 14:
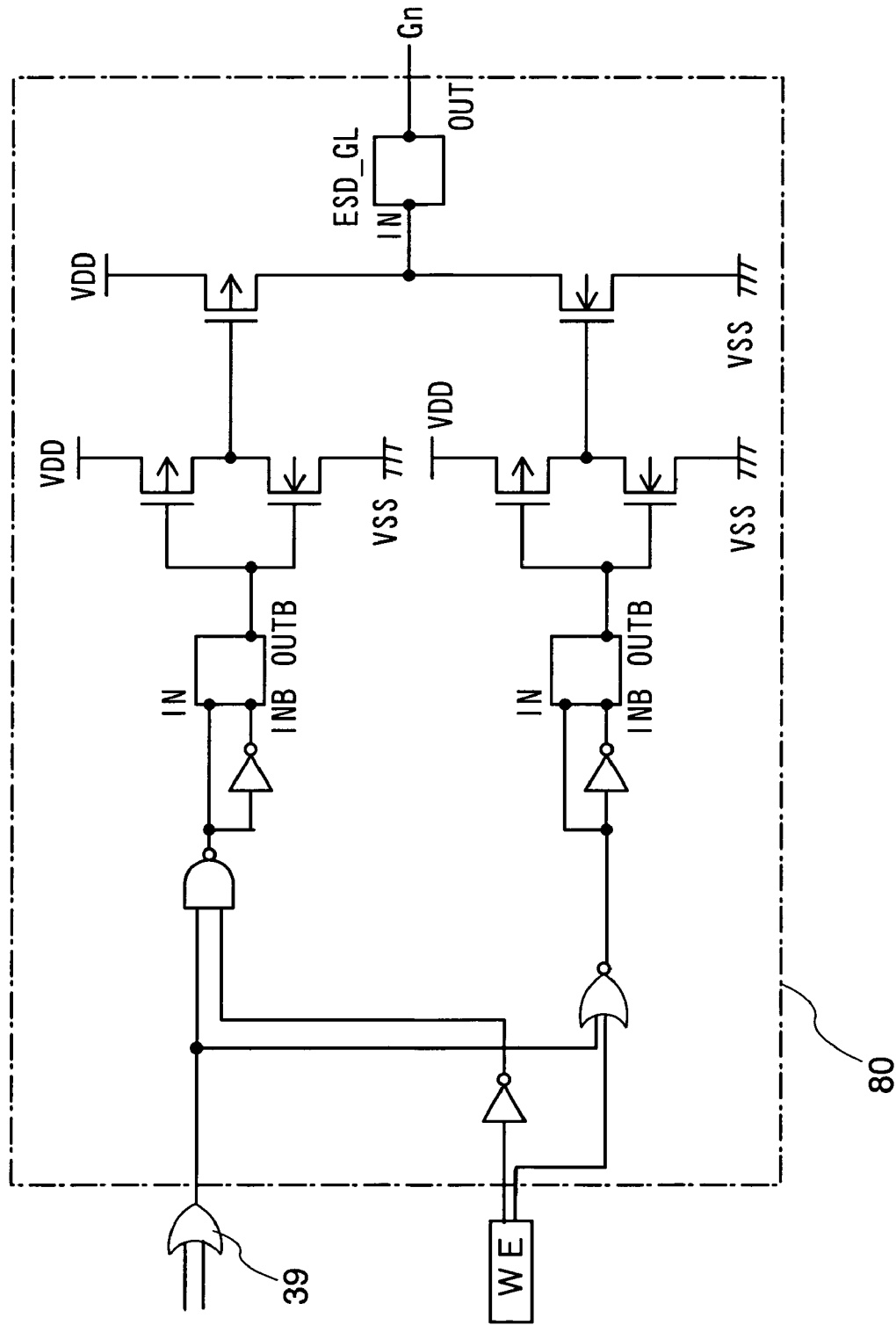
FIG. 14 is a diagram showing a driver circuit of the invention.

FIG. 14 shows a configuration of the buffer circuit 80 having a plurality of inverters, a NAND circuit and a plurality of transistors. The signals as shown in FIGS. 4A to 4E are inputted to a scan line (Gn) depending on the input of a control signal (GL) and the WE signal. The control signal as well as the WE signal is inputted to the buffer circuit 80 through the OR circuit 39. The control signal (GL) turns on the switching transistor 11 during a reverse bias voltage applying period, thereby the gate electrode of the driving transistor 12 can be brought into an electrically non-floating state.

The tri-state buffer circuit has a function to prevent charge and discharge of a scan line by one of the first scan line driver circuit 41 and the second scan line driver circuit 42 from being interrupted by the output of the other of the drivers. Accordingly, not only the tri-state buffer circuit but also an analog switch, a clocked inverter or the like may be used as the selection circuit 55, as long as it has such a function.

If a protection circuit is provided in the first scan line driver circuit 41, malfunction, degradation and destruction of elements can be prevented even when a clock signal and a data signal each containing noise are inputted to an input node.

This embodiment mode can be freely combined with the aforementioned embodiment modes.

Embodiment Mode 4

In this embodiment mode, a temperature compensation function is described.

Figure 17:
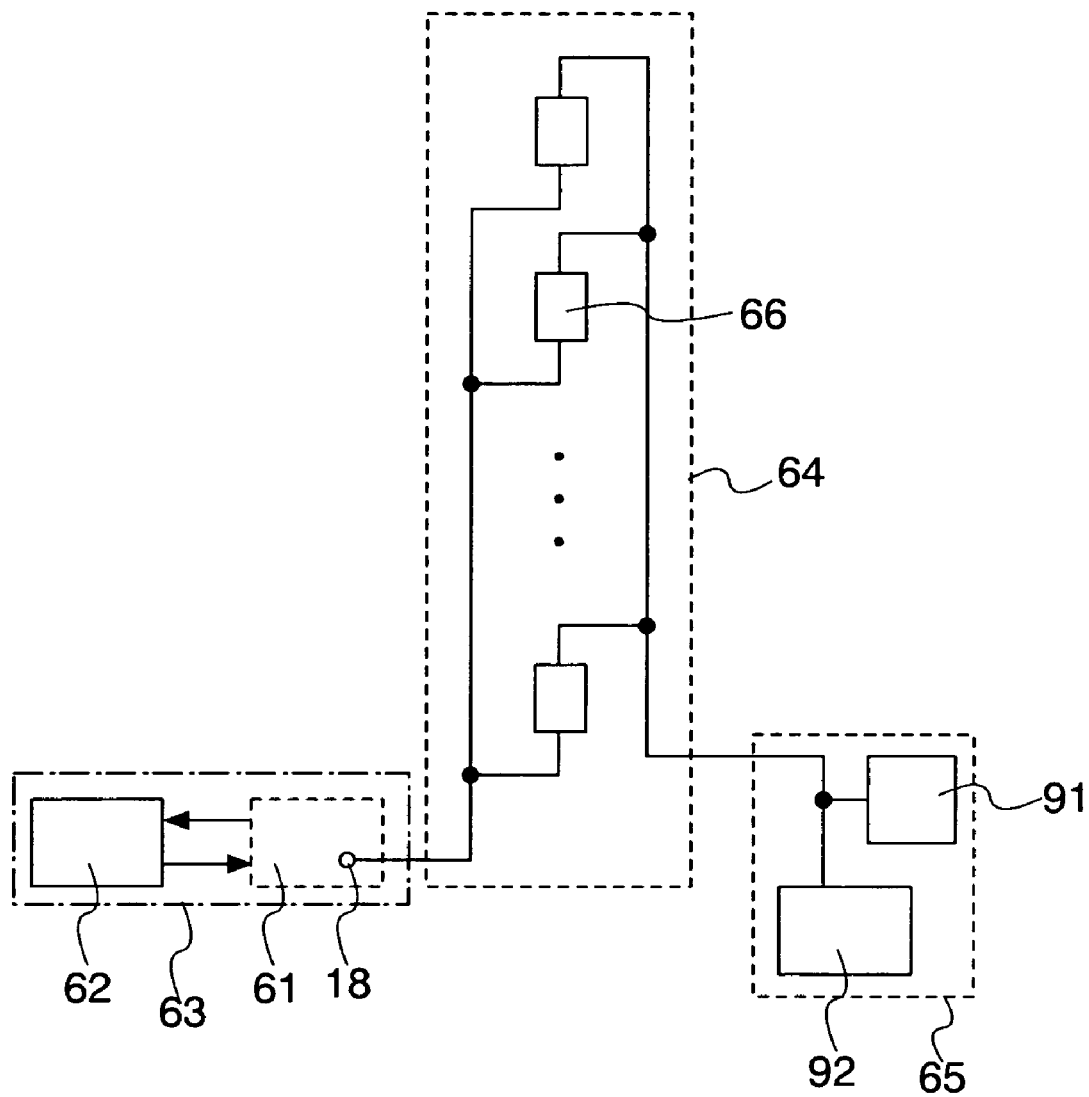
FIG. 17 is a diagram showing a temperature compensation function of the invention.

As shown in FIG. 17, a temperature compensation function is achieved by the monitor circuit 64 operating depending on the ambient temperature, the control circuit 65, and the power supply control circuit 63. The monitor circuit 64 has a monitor element 66 as shown in the drawing. One electrode of the monitor element is connected to a power supply with a constant potential (grounded in the drawing), while the other electrode is connected to the control circuit 65. The control circuit 65 includes a constant current source 91 and an amplifier 92. The power supply control circuit 63 includes the power supply circuit 61 and the controller 62. Note that the power supply circuit 61 is preferably a variable power supply that can change the power supply potential to be supplied.

Description is made on steps of detecting the ambient temperature by the monitor element. A constant current is supplied between the two electrodes of the monitor element from the constant current source 91. That is to say, the current value of the monitor element is always constant. When the ambient temperature varies in this state, the resistant value of the monitor element itself changes. When the resistant value of the monitor element changes, a potential difference between the two electrodes of the monitor element changes because the current value thereof is always constant. Variations in the ambient temperature are detected by detecting such a change in the potential difference of the monitor element. More specifically, the potential of the electrode of the monitor element, which is connected to the power supply with a constant potential, does not change; therefore, the potential of the electrode connected to the constant current source 91 is detected. A signal including data on such a change in the potential of the light emitting element is supplied to the amplifier 92 to be amplified, and then outputted to the power supply control circuit 63. The power supply control circuit 63 changes the power supply potential to be supplied to the pixel area 40 through the amplifier 92 in accordance with the output of the monitor circuit 64. Thus, the power supply potential can be corrected depending on changes in temperature. In other words, it is possible to reduce variations in current value due to changes in temperature.

Although a plurality of monitor elements are provided in the configuration shown in the drawing, the invention is not limited to this, and the number of monitor elements provided in the monitor circuit 64 is not particularly limited. Such a temperature compensation function can be performed without requiring user operation, and thus the compensation can be continued after the display device is supplied to end users, which results in longer life of the product. This embodiment mode can be freely combined with the aforementioned embodiment modes.

Embodiment Mode 5

In this embodiment mode, examples of layout and cross sectional view of a pixel configuration are described.

Figure 2:
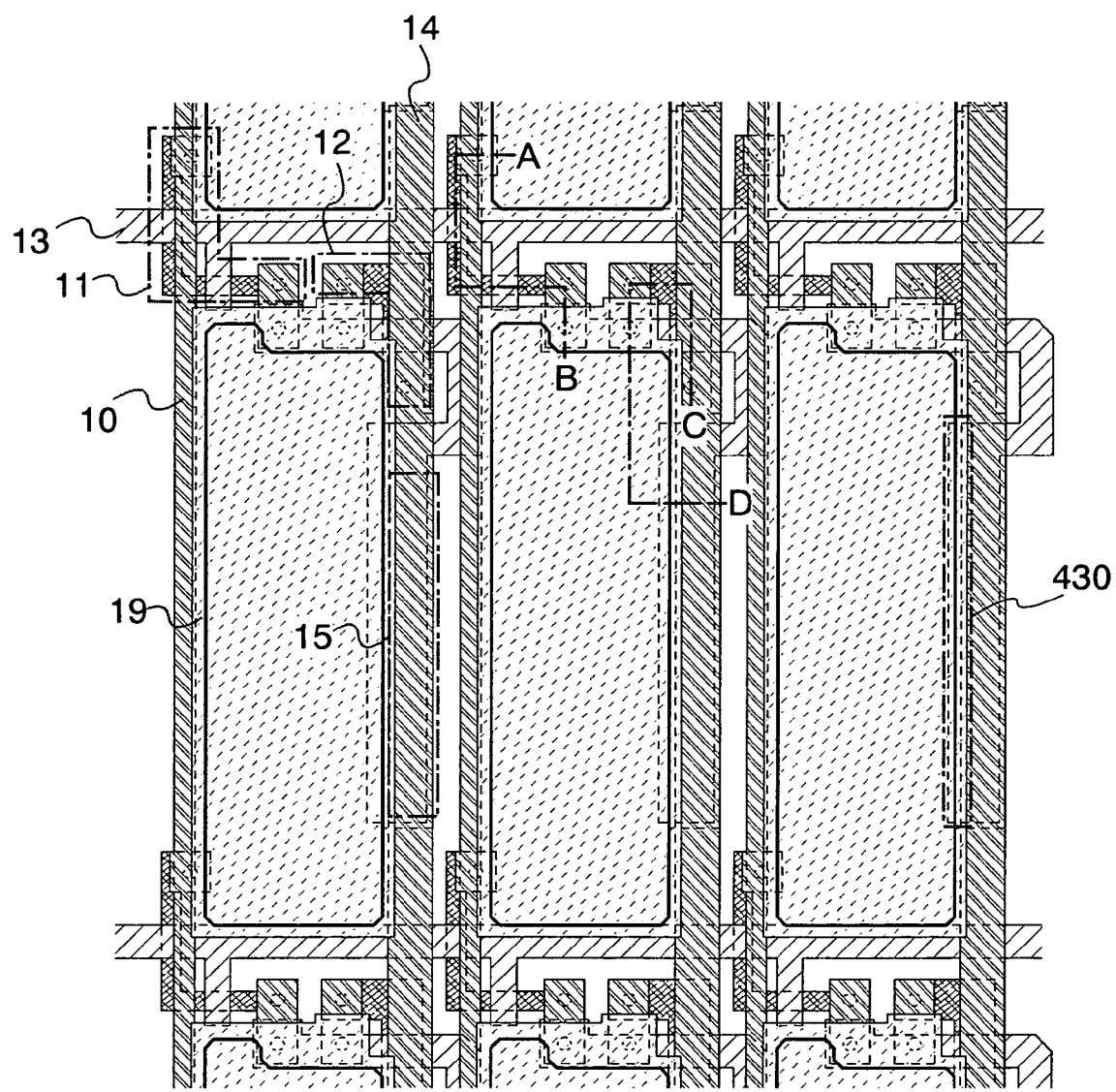
FIG. 2 is a top plan view showing a pixel area of the invention.

FIG. 2 shows a layout example of the pixel configuration shown in FIG. 1. First, a semiconductor film is formed to constitute the switching transistor 11 and the driving transistor 12. Then, a first conductive film is formed with an insulating film functioning as a gate insulating film interposed therebetween. The first conductive film can be used as gate electrodes of the switching transistor 11 and the driving transistor 12, and as the scan line 13. At this time, the switching transistor 11 preferably has a double gate structure.

Subsequently, a second conductive film is formed with an insulating film functioning as an interlayer insulating film interposed therebetween. The second conductive film can be used as drain wirings and source wirings of the switching transistor 11 and the driving transistor 12, and as the signal line 10 and the power supply line 14. At this time, the capacitor 15 can be formed by stacking the first conductive film, the insulating film functioning as an interlayer insulating film, and the second conductive film. The gate electrode of the driving transistor 12 is connected to the other electrode of the switching transistor 11 through a contact hole.

A pixel electrode 19 is formed in an opening of the pixel. The pixel electrode 19 is connected to the other electrode of the driving transistor 12. If an insulating film and the like are provided between the second conductive film and the pixel electrode 19, the pixel electrode 19 is required to be connected to the other electrode of the driving transistor 12 through a contact hole. If the insulating film and the like are not provided, the pixel electrode 19 can be connected directly to the other electrode of the driving transistor 12.

In the layout shown in FIG. 2, the first conductive film and the pixel electrode may overlap each other as in an area 430 if a high aperture ratio is to be obtained. In such an area 430, there may occur unwanted capacitive coupling. It is prevented that the potential changes due to unwanted capacitive coupling by the driving method of the invention.

Figure 3:
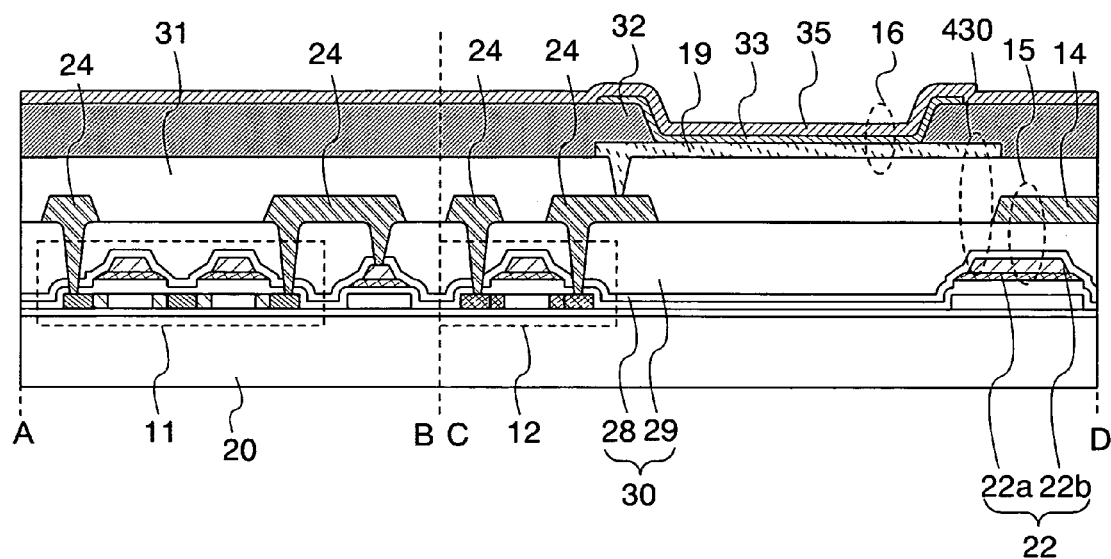
FIG. 3 is a cross sectional view showing a pixel area of the invention.

FIG. 3 is a cross sectional view obtained by cutting along lines A-B and C-D of FIG. 2.

A patterned semiconductor film is formed over an insulating substrate 20 with a base film interposed therebetween. For the insulating substrate 20, for example, a glass substrate such as barium borosilicate glass and alumino borosilicate glass, a quartz substrate, a stainless (SUS) substrate and the like can be employed. A substrate made of a flexible synthetic resin such as plastic typified by PET (polyethylene terephthalate), PEN (polyethylene naphthalate), and PES (polyether sulfide) and acrylic generally has a lower heat resistance as compared with other substrates, though it may be used if it can be resistant to the processing temperature during manufacturing steps. The base film can be formed by using an insulating film such as silicon oxide, silicon nitride, and silicon nitride oxide.

An amorphous semiconductor film is formed over the base film so as to have a thickness of 25 to 100 nm (preferably, 30 to 60 nm). Silicon germanium as well as silicon can be used for the amorphous semiconductor film.

The amorphous semiconductor film is crystallized as needed to form a crystalline semiconductor film. The crystallization can be performed by using a furnace, laser irradiation, irradiation of light emitted from a lamp (hereinafter referred to as lamp annealing), or a combination of them. For example, a crystalline semiconductor film is formed by adding a metal element to an amorphous semiconductor film and applying a heat treatment using a furnace. A semiconductor film is preferably added with a metal element since it can be crystallized at low temperature.

The thus formed crystalline semiconductor film is patterned to have a predetermined shape. The predetermined shape is to be the switching transistor 11 and the driving transistor 12 as shown in FIG. 2.

Then, an insulating film functioning as a gate insulating film is formed. The insulating film is formed to have a thickness of 10 to 150 nm, and preferably 20 to 40 nm, so as to cover the semiconductor film. The insulating film may have a single layer structure or a stacked layer structure using a silicon oxynitride film, a silicon oxide film and the like.

A first conductive film functioning as a gate electrode is formed over the semiconductor film with a gate insulating film interposed therebetween. The gate electrode may have a single layer structure or a stacked layer structure, though a stacked layer structure of conductive films 22a and 22b is used in this embodiment mode. Each of the conductive films 22a and 22b may be formed by using an element selected from W, Ti, Mo, Al, and Cu, or an alloy or compound material mainly containing such an element. In this embodiment mode, the conductive film 22a is made of a tantalum nitride film with a thickness of 10 to 50 nm, for example 30 nm, and the conductive film 22b is stacked thereon using a tungsten film with a thickness of 200 to 400 nm, for example 370 nm.

An impurity element is added with the gate electrode used as a mask. At this time, a low concentration impurity region may be formed in addition to a high concentration impurity region, which is called an LDD (Lightly Doped Drain) structure. In specific, a structure where the low concentration impurity region overlaps the gate electrode is called a GOLD (Gate-drain Overlapped LDD) structure. An N-channel transistor preferably has the low concentration impurity region in particular.

This low concentration impurity region may cause unwanted capacitance. Accordingly, the driving method of the invention is preferably adopted in the case of forming a pixel using a TFT having an LDD structure or a GOLD structure.

Subsequently, insulating films 28 and 29 functioning as an interlayer insulating film 30 are formed. The insulating film 28 may be formed of an insulating film containing nitrogen, and in this embodiment mode, a silicon nitride film with a thickness of 100 nm is formed by plasma CVD. Meanwhile, the insulating film 29 may be formed by using an organic material or an inorganic material. The organic material includes polyimide, acrylic, polyamide, polyimide amide, resist material, benzocyclobutene, siloxane, and polysilazane. Siloxane is composed of a skeleton structure formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed using as a starting material a liquid material containing a polymer material having the bond of silicon (Si) and nitrogen (N). The inorganic material includes an insulating film containing oxygen or nitrogen such as silicon oxide ($SiO_x$), silicon nitride ($SiN_x$), silicon oxynitride ($SiO_xN_y$) (x>y), and silicon nitride oxide ($SiN_xO_y$) (x>y) (x, y= 1, 2 . . . ). Alternatively, the insulating film 29 may have a stacked layer structure of these insulating films. In specific, when the insulating film 29 is formed by using an organic material, uniformity is improved while moisture and oxygen are absorbed into the organic material. In order to prevent this, an insulating film containing an inorganic material may be formed on the organic material. An insulating film containing nitrogen is preferably used as the inorganic material since alkali ions such as Na can be prevented from entering. An organic material is preferably used for the insulating film 29 since uniformity can be improved.

A contact hole is formed in the interlayer insulating film 30. Then, a second conductive film is formed, which functions as source and drain wirings 24 of the switching transistor 11 and the driving transistor 12, the signal line 10, and the power supply line 14. The second conductive film may be formed by using an element such as aluminum (Al), titanium (Ti), molybdenum (Mo), tungsten (W), and silicon (Si), or an alloy film using such elements. In this embodiment mode, the second conductive film is formed by stacking a titanium (Ti)

film, a titanium nitride (TiN) film, an aluminum-silicon alloy (Al—Si) film, and a titanium (Ti) film, which have a thickness of 60 nm, 40 nm, 300 nm, and 100 nm respectively.

An insulating film 31 is formed so as to cover the second conductive film. The insulating film 31 can be formed by using any of the materials of the interlayer insulating film 30 described above. A high aperture ratio can be achieved by providing such an insulating film 31.

A pixel electrode (also referred to as a first electrode) 19 is formed in the opening provided in the insulating film 31. In order to increase the step coverage of the pixel electrode in the opening, the end portion of the opening is preferably roundish so as to have a plurality of radii of curvature. The pixel electrode 19 may be formed by using a light transmissive material such as indium tin oxide (ITO), indium zinc oxide (IZO) obtained by mixing 2 to 20% of zinc oxide (ZnO) into indium oxide, ITO—$SiO_x$ (referred to as ITSO or NITO for convenience) obtained by mixing 2 to 20% of silicon oxide ($SiO_2$) into indium oxide, organic indium, and organotin. The pixel electrode 19 may also be formed by using a light shielding material such as an element selected from Ag, tantalum, tungsten, titanium, molybdenum, aluminum, and copper, or an alloy or compound material mainly containing such an element. When the insulating film 31 is formed by using an organic material to improve uniformity, the surface uniformity on which the pixel electrode is formed is improved, which allows a constant voltage to be applied and prevents a short circuit.

There may occur unwanted capacitive coupling in the area 430 where the first conductive film overlaps the pixel electrode 19. It is prevented that the potential changes due to unwanted capacitive coupling by the driving method of the invention.

Subsequently, an electroluminescent layer 33 is formed by vapor deposition or ink jet printing. The electroluminescent layer 33 is formed by arbitrarily combining an electron injection layer (EIL), an electron transporting layer (ETL), a light emitting layer (EML), a hole transporting layer (HTL), a hole injection layer (HIL) and the like using an organic material or an inorganic material. Note that the boundaries between each layer are not necessarily clearly defined, and there is also a case where materials of the respective layers are partially mixed with each other, which blurs the boundaries. The structure of the electroluminescent layer 33 is not limited to the aforementioned stacked layer structure.

A second electrode 35 is formed by sputtering or vapor deposition. The first electrode (pixel electrode) 19 and the second electrode 35 of the electroluminescent layer (light emitting element) function as an anode or a cathode depending on a pixel configuration.

The anode is preferably formed using a metal, an alloy, a conductive compound, and a mixture thereof, each of which has a high work function (work function of 4.0 eV or more). More specifically, it is possible to use ITO, IZO obtained by mixing 2 to 20% of zinc oxide (ZnO) into indium oxide, gold (Au), platinum (Pt), nickel (Ni), tungsten (W), chromium (Cr), molybdenum (Mo), iron (Fe), cobalt (Co), copper (Cu), palladium (Pd), nitride of a metal material (TiN), and the like.

The cathode is preferably formed using a metal, an alloy, a conductive compound, and a mixture thereof, each of which has a low work function (work function of 3.8 eV or less). More specifically, it is possible to use an element belonging to Group 1 or Group 2 of the periodic table, namely an alkaline metal such as Li and Cs, an alkaline earth metal such as Mg, Ca and Sr, an alloy (Mg:Ag, Al:Li) or a compound (LiF, CsF, $CaF_2$) containing them, and a transition metal including a rare earth metal. Since the cathode is required to transmit light, these metals or alloys containing them are formed extremely thin and stacked with a metal (including an alloy) such as ITO.

A protective film may be formed thereafter so as to cover the second electrode 35. As the protective film, a silicon nitride film or a DLC film may be used.

In this manner, the pixel of the light emitting device can be completed.

Embodiment Mode 6

In this embodiment mode, a cross sectional view is shown, which is different from the one shown in the aforementioned embodiment mode. Note that description of the same portion as FIG. 3 is omitted.

Figure 9:
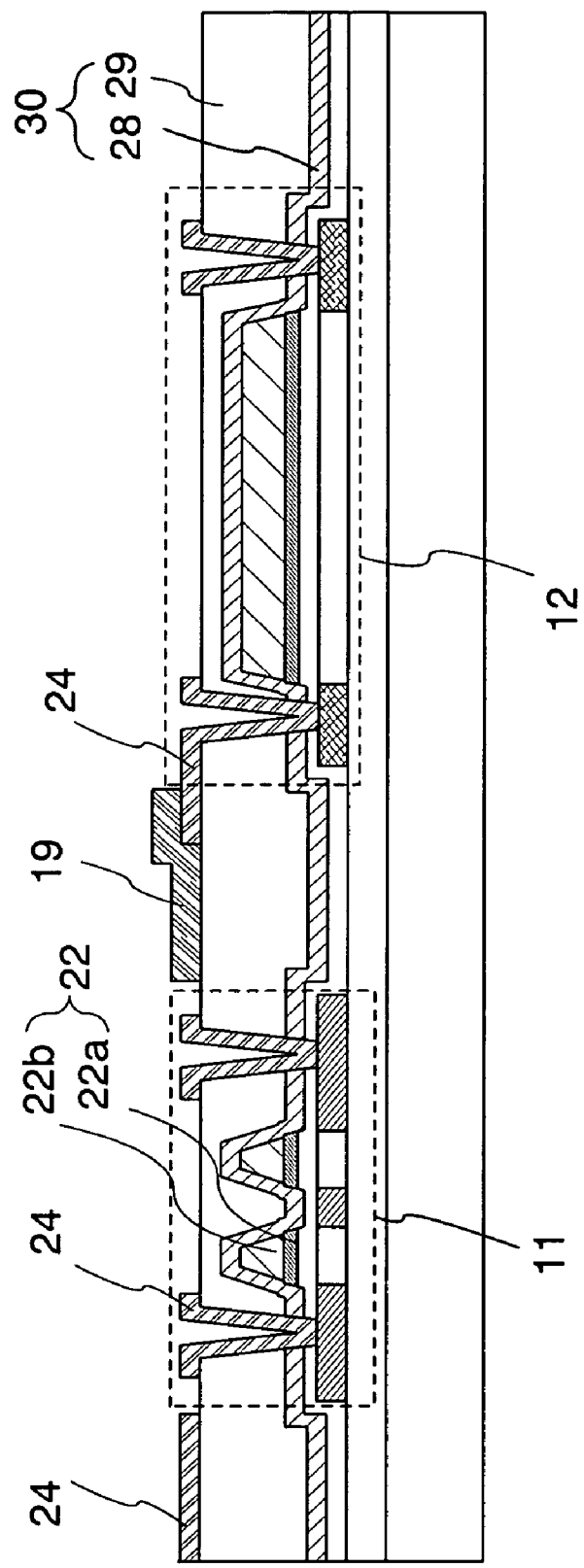
FIG. 9 is a cross sectional view showing a pixel area of the invention.

In FIG. 9, the steps up to the formation of the interlayer insulating film 30 are performed in the same manner as in FIG. 3. Then, a contact hole is formed in the interlayer insulating film 30, and the signal line 10 and the source and drain wirings 24 are formed. Subsequently, the pixel electrode 19 is formed without providing the insulating film 31.

Figure 10:
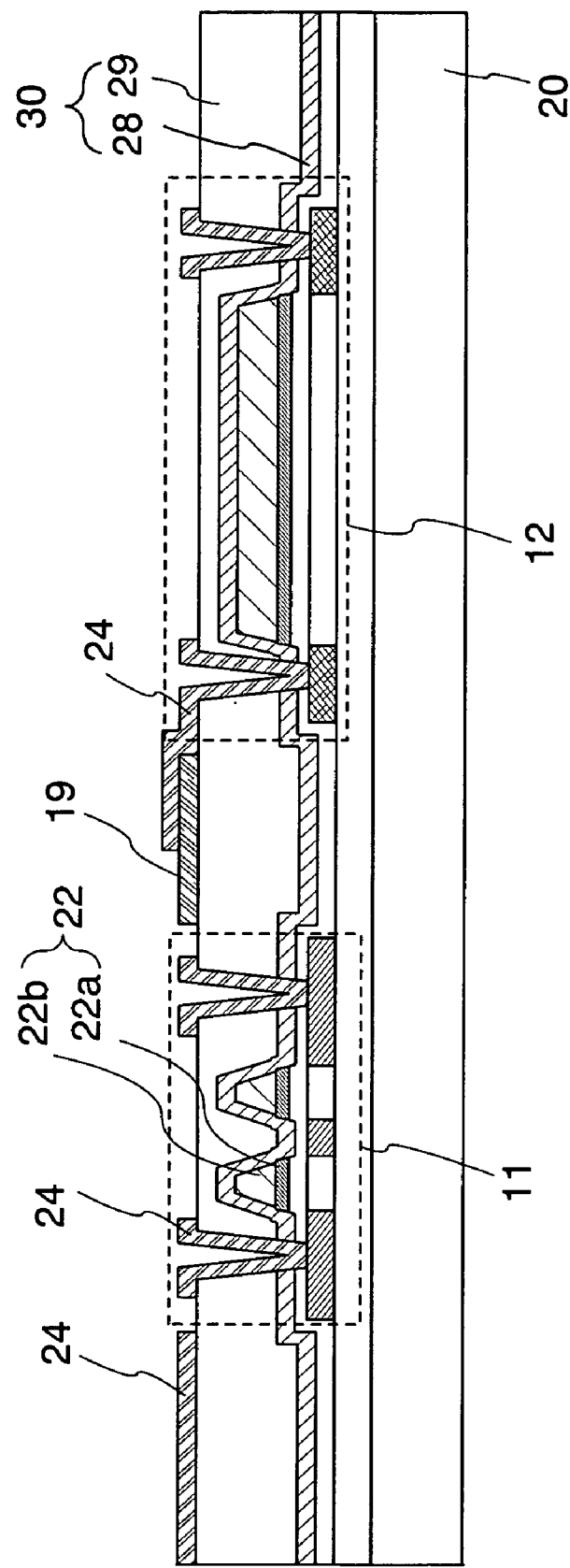
FIG. 10 is a cross sectional view showing a pixel area of the invention.

In FIG. 10, the steps up to the formation of the interlayer insulating film 30 are performed in the same manner as in FIG. 3. Then, a contact hole is formed in the interlayer insulating film 30 and the pixel electrode 19 is formed. Subsequently, the signal line 10 and the source and drain wirings 24 are formed. In FIG. 10 also, the insulating film 31 is not provided.

In FIGS. 9 and 10, the insulating film 32, the electroluminescent layer 33, the second electrode 35 and the like are formed thereafter in the same manner as in FIG. 3, thereby the pixel of the light emitting device can be completed.

Even if the insulating film 31 is not provided, there may occur unwanted capacitive coupling. It is prevented that the potential changes due to unwanted capacitive coupling by the driving method of the invention, which prevents black float.

Embodiment Mode 7

Described in this embodiment mode is a pixel configuration to which the driving method of the invention can be applied. Note that description of the same portion as FIG. 1 is omitted.

Figure 6:
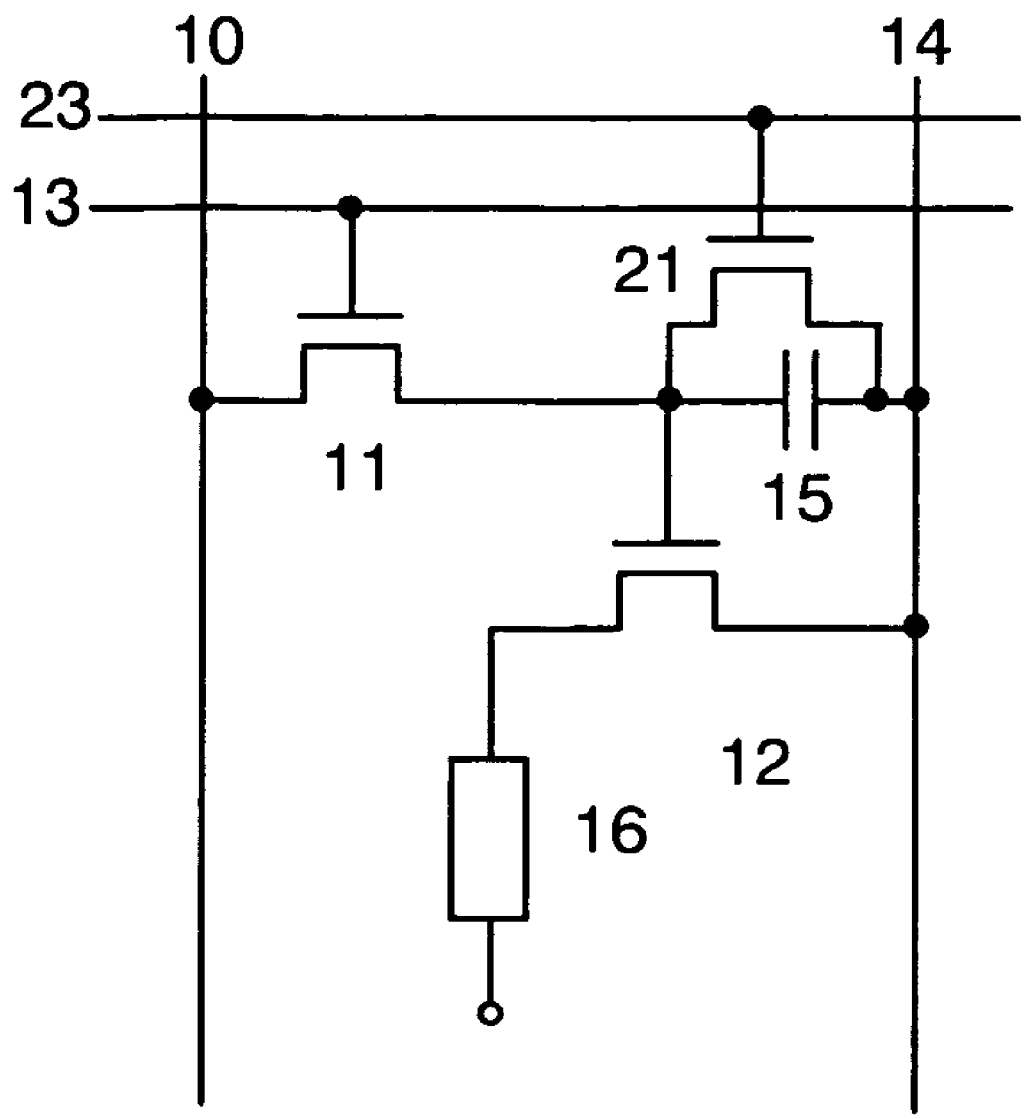
FIG. 6 is a diagram showing a pixel circuit of the invention.

FIG. 6 shows a pixel configuration where a third transistor 21 is provided at both ends of the capacitor 15 additionally to the pixel configuration shown in FIG. 1. The third transistor 21 has a function of discharging charges accumulated in the capacitor 15 during every predetermined period. This third transistor 21 is also referred to as an erasing transistor. The predetermined period is controlled by the scan line 23 connected to a gate electrode of the third transistor 21.

If a plurality of subframe periods are provided, for example, the charges of the capacitor 15 are discharged by the third transistor 21 during a short subframe period, leading to increased duty ratio.

In such a pixel configuration also, the switching transistor 11 is turned on in the case where a reverse bias voltage is applied. As a result, the gate electrode of the driving transistor 12 is brought into an electrically non-floating state, thereby it is prevented that the potential changes due to unwanted capacitive coupling i. Further, when a non-lighting signal is inputted from the signal line 10 to the switching transistor 11 that is turned on, the light emitting element emits no light. By adopting such a driving method, a reverse bias voltage can be applied correctly and black float can be prevented in the pixel configuration shown in FIG. 6.

Figure 7A:
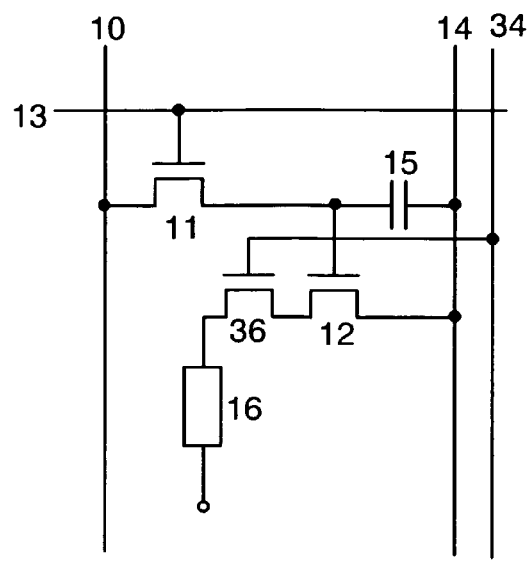
FIGS. 7A to 7C are diagrams each showing a pixel circuit of the invention.

FIG. 7A shows a pixel configuration where a fourth transistor 36 is provided between the driving transistor 12 and the light emitting element 16 additionally to the pixel configuration shown in FIG. 1. A gate electrode of the fourth transistor 36 is connected to a second power supply line 34 with a fixed potential. Therefore, a constant current can be supplied to the light emitting element 16 independently of a gate-source voltage of the driving transistor 12 and the fourth transistor 36. This fourth transistor 36 is also referred to as a current control transistor.

Figure 7B:
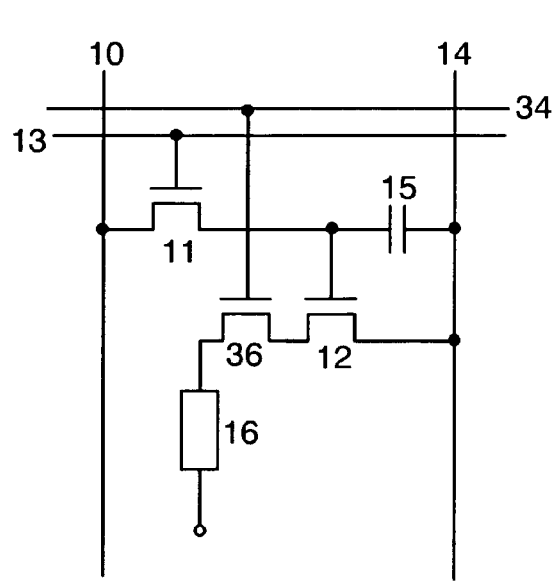

FIG. 7B shows a pixel configuration different from the one shown in FIG. 7A in that the second power supply 34 with a fixed potential is provided in parallel to the scan line.

Figure 7C:
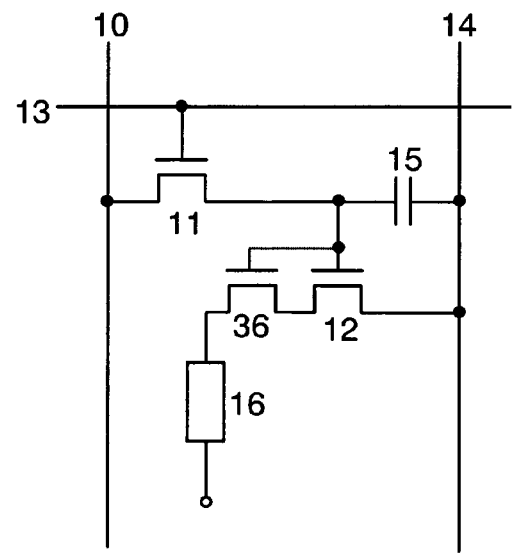

FIG. 7C shows a pixel configuration different from the ones shown in FIGS. 7A and 7B in that the gate electrode of the fourth transistor, which has a fixed potential, is connected to the gate electrode of the driving transistor 12. In the pixel configuration shown in FIG. 7C, an additional power supply line is not required to be provided; therefore, the aperture ratio can be maintained.

In such pixel configurations, the switching transistor 11 is turned on in the case where a reverse bias voltage is applied. As a result, the gate electrode of the driving transistor 12 is brought into an electrically non-floating state, thereby it is prevented that the potential changes due to unwanted capacitive coupling. Further, when a non-lighting signal is inputted from the signal line 10 to the switching transistor 11 that is turned on, the light emitting element emits no light. By adopting such a driving method, a reverse bias voltage can be applied correctly and black float can be prevented in the pixel configurations shown in FIGS. 7A to 7C.

Figure 8:
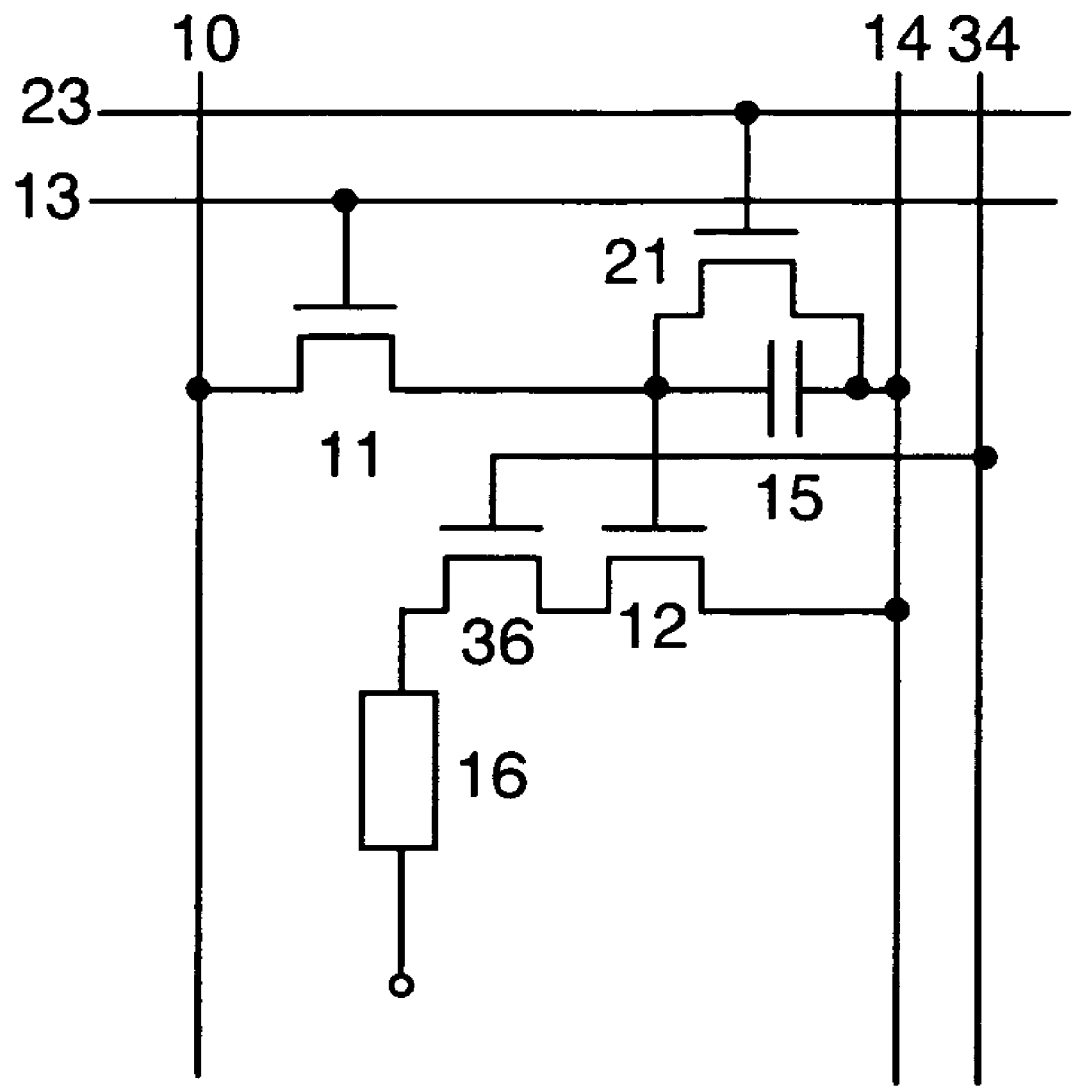
FIG. 8 is a diagram showing a pixel circuit of the invention.

FIG. 8 shows a pixel configuration where the erasing transistor shown in FIG. 6 is added to the pixel configuration shown in FIG. 7A. The erasing transistor allows the charges of the capacitor 15 to be discharged. It is needless to say that the erasing transistor can be added to the pixel configuration shown in FIG. 7B or 7C.

In such a pixel configuration, the switching transistor 11 is turned on in the case where a reverse bias voltage is applied. As a result, the gate electrode of the driving transistor 12 is brought into an electrically non-floating state, thereby it is prevented that the potential changes due to unwanted capacitive coupling. Further, when a non-lighting signal is inputted from the signal line 10 to the switching transistor 11 that is turned on, the light emitting element emits no light. By adopting such a driving method, a reverse bias voltage can be applied correctly and black float can be prevented in the pixel configuration shown in FIG. 8.

That is to say, the reverse bias voltage applying method of the invention can be applied to any pixel configuration.

Embodiment Mode 8

In this embodiment mode, a pixel configuration having only one polarity, namely a single channel configuration is described.

Figure 15A:
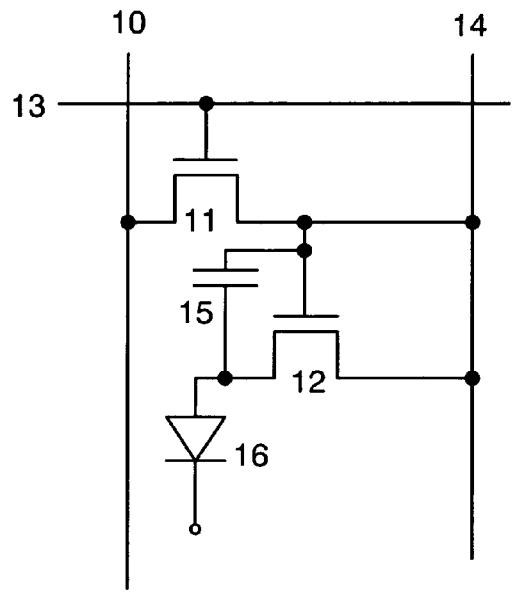
FIGS. 15A and 15B are diagrams each showing a pixel circuit of the invention and FIG. 15C is a cross sectional view thereof.

FIG. 15A shows a pixel configuration where N-channel transistors are used for the switching transistor 11 and the driving transistor 12, and the pixel electrode 19 is an anode while the second electrode (counter electrode) is a cathode. In this case, when a forward bias voltage is applied to the light emitting element 16 so that a current flows in the forward direction, the power supply line 14 functions as a high potential power supply, and a current flows from the pixel electrode to the counter electrode. When a reverse bias voltage is applied to the light emitting element 16, the power supply line 14 functions as a low potential power supply, and a current flows from the counter electrode to the pixel electrode. The capacitor 15 is provided between the pixel electrode of the light emitting element 16 and the gate electrode of the driving transistor 12 so as to hold a gate-source voltage of the driving transistor 12.

Figure 15B:
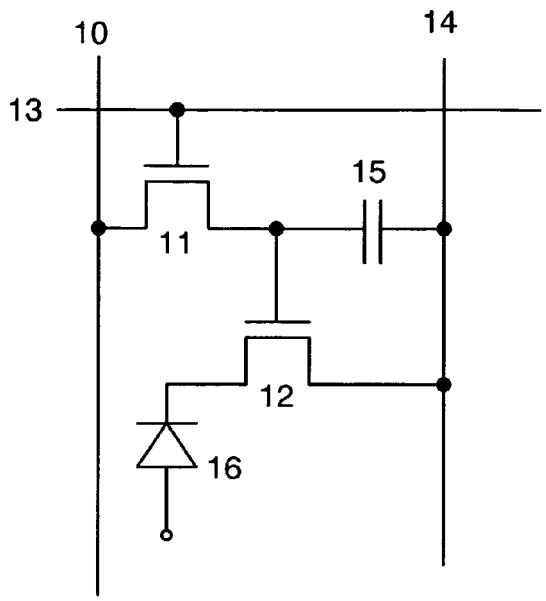

FIG. 15B shows a pixel configuration where the direction of current flowing through the light emitting element 16 is opposite to that shown in FIG. 15A. In other words, shown is a pixel configuration where the pixel electrode 19 is a cathode while the second electrode (counter electrode) is an anode. In this case, when a forward bias voltage is applied to the light emitting element 16 so that a current flows in the forward direction, the power supply line 14 functions as a low potential power supply, and a current flows from the counter electrode to the pixel electrode. When a reverse bias voltage is applied to the light emitting element 16, the power supply line 14 functions as a high potential power supply, and a current flows from the pixel electrode to the counter electrode. The capacitor 15 is provided between the power supply line 14 and the gate electrode of the driving transistor 12 so as to hold a gate-source voltage of the driving transistor 12.

Each of the pixel configurations shown in FIGS. 15A and 15B can have the same cross sectional structure as that shown in FIG. 3. In the case of the pixel configuration shown in FIG. 15A, however, the capacitor 15 is required to be formed between the pixel electrode of the light emitting element 16 and the gate electrode of the driving transistor 12. Meanwhile, in the case of the pixel configuration shown in FIG. 15B, the anode and the cathode are required to be inverted from each other. Accordingly, the anode formed on the electroluminescent layer 33 is preferably patterned for each pixel, so that signal input can be controlled easily.

Since N-channel transistors are used for both the switching transistor 11 and the driving transistor 12 according to this embodiment mode, it is not necessary to form the transistors separately. Thus, the yield of the thin film transistors and the like can be improved, leading to cost reduction of the light emitting device.

Figure 15C:
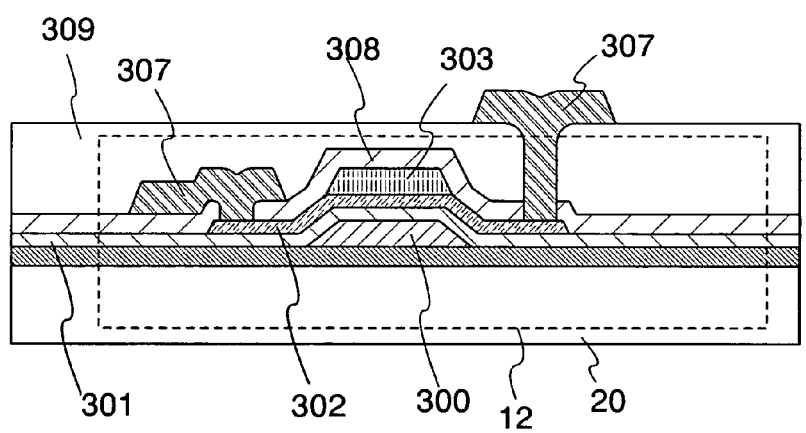

Such a single channel pixel configuration is preferably adopted when an amorphous semiconductor film is used for each transistor. That is to say, a single-channel pixel configuration is suitable in the case of using an amorphous semiconductor film since N-channel transistors can be formed easily with the amorphous semiconductor film. FIG. 15C is an enlarged view of the driving transistor 12 formed by using an amorphous semiconductor film. An insulating film functioning as a base film is formed over the insulating substrate 20, and a conductive film 300 functioning as a gate electrode is formed over the insulating film. An insulating film 301 functioning as a gate insulating film is formed so as to cover the conductive film 300, and an amorphous semiconductor film 302 is formed thereover. A channel protective film 303 is formed over the amorphous semiconductor film 302, which can be used as a mask for forming an N-channel impurity layer (n+region). Then, an insulating film 308 functioning as a protective film is formed.

Source and drain wirings 307 are formed to be connected to the impurity region. In this embodiment mode, an insulating film 309 is formed in order to increase the uniformity. The insulating film 309 is preferably formed by using an organic material to increase the uniformity. The source and drain wirings 307 can be formed over the insulating film 308 or the insulating film 309.

Such a transistor including an amorphous semiconductor film has a large patterned area and a large gate electrode in order to improve the current supply capacity. Accordingly, capacitive coupling increases, in which case the driving method of the invention is preferably adopted.

The transistor including an amorphous semiconductor film is preferably applied to a single channel pixel configuration. If the amorphous semiconductor film is used, no crystallization step is required; therefore, cost reduction of the light emitting device and the like can be achieved.

In such pixel configurations, the switching transistor 11 is turned on in the case where a reverse bias voltage is applied. As a result, the gate electrode of the driving transistor 12 is brought into an electrically non-floating state, thereby it is prevented that the potential changes due to unwanted capacitive coupling. Further, when a non-lighting signal is inputted from the signal line 10 to the switching transistor 11 that is turned on, the light emitting element emits no light. By adopting such a driving method, a reverse bias voltage can be applied correctly and black float can be prevented in the pixel configuration shown in FIGS. 15A to 15C.

Although only the N-channel transistors are used in this embodiment mode, it is needless to say that only P-channel transistors may be used in a single-channel pixel configuration.

Embodiment Mode 9

A display device having a pixel area including a light emitting element can be applied to various electronic apparatuses such as a television set (television, television receiver), a digital camera, a digital video camera, a mobile phone set (mobile phone), a portable information terminal such as a PDA, a portable game machine, a monitor, a computer, a sound reproducing device such as a car audio system, and an image reproducing device provided with a recording medium such as a home game machine. Specific examples of these electronic apparatuses are described with reference to FIGS. 16A to 16F.

Figure 16A:
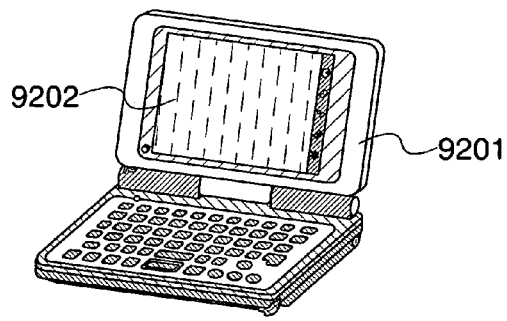
FIGS. 16A to 16F are views each showing an electronic apparatus of the invention.

FIG. 16A shows a portable information terminal using the light emitting device of the invention, which includes a main body 9201, a display portion 9202, and the like. The invention allows a reverse bias voltage to be applied correctly, which results in longer life of the light emitting element. In addition, since black float can be prevented according to the invention, images can be displayed with high quality.

Figure 16B:
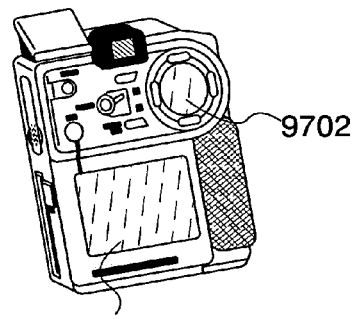

FIG. 16B shows a digital video camera using the light emitting device of the invention, which includes display portions 9701 and 9702, and the like. The invention allows a reverse bias voltage to be applied correctly, which results in longer life of the light emitting element. In addition, since black float can be prevented according to the invention, images can be displayed with high quality.

Figure 16C:
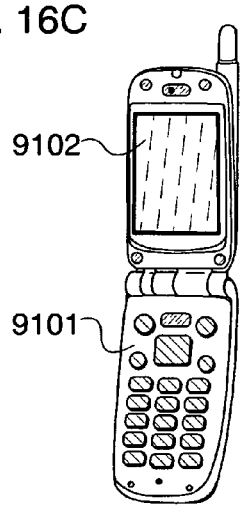

FIG. 16C shows a portable terminal using the light emitting device of the invention, which includes a main body 9101, a display portion 9102, and the like. The invention allows a reverse bias voltage to be applied correctly, which results in longer life of the light emitting element. In addition, since black float can be prevented according to the invention, images can be displayed with high quality.

Figure 16D:
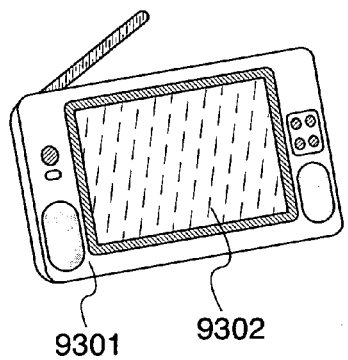

FIG. 16D shows a portable television set using the light emitting device of the invention, which includes a main body 9301, a display portion 9302, and the like. The invention allows a reverse bias voltage to be applied correctly, which results in longer life of the light emitting element. In addition, since black float can be prevented according to the invention, images can be displayed with high quality.

Figure 16E:
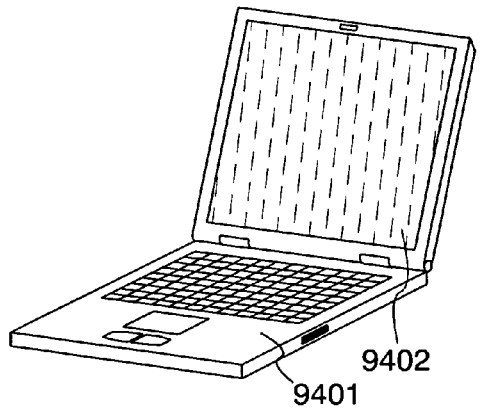

FIG. 16E shows a portable computer using the light emitting device of the invention, which includes a main body 9401, a display portion 9402, and the like. The invention allows a reverse bias voltage to be applied correctly, which results in longer life of the light emitting element. In addition, since black float can be prevented according to the invention, images can be displayed with high quality.

Figure 16F:
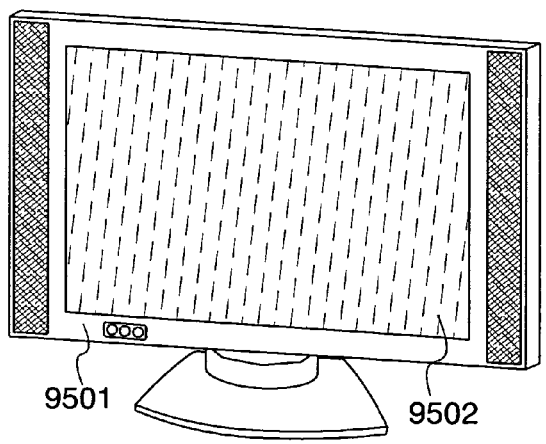

FIG. 16F shows a television set using the light emitting device of the invention, which includes a main body 9501, a display portion 9502, and the like. The invention allows a reverse bias voltage to be applied correctly, which results in longer life of the light emitting element. In addition, since black float can be prevented according to the invention, images can be displayed with high quality.

If the aforementioned electronic apparatuses use a rechargeable battery, the life of them increases with reduction in power consumption, thereby the charge of the rechargeable battery can be saved.

Embodiment Mode 10

Described in this embodiment mode is a configuration of a scan line driver circuit to which the driving method of the invention can be applied.

Figure 18A:
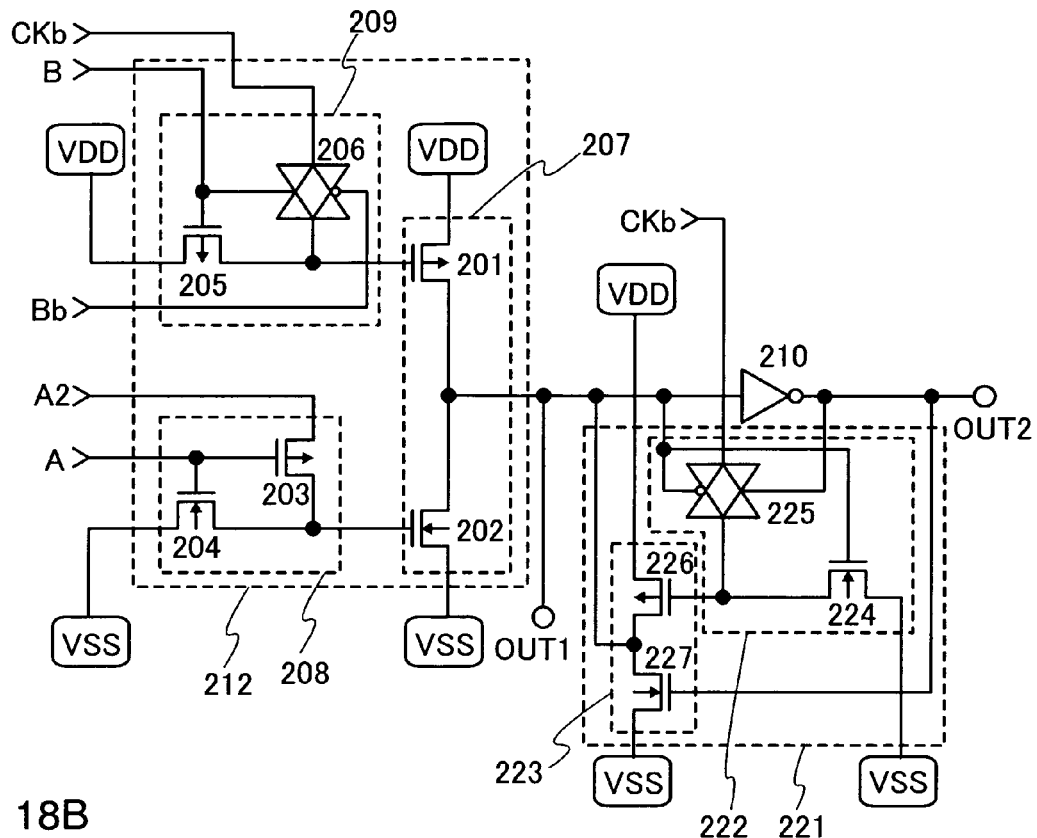
FIGS. 18A and 18B are diagrams each showing a driver circuit of the invention.

FIG. 18A shows one mode of a flip flop circuit included in a shift register of a scan line driver circuit. The flip flop circuit has a clocked inverter 212, an inverter 210, and a clocked inverter 221. The clocked inverter 212 has an inverter 207 including a transistor 201 and a transistor 202, a first compensation circuit 208 including a transistor 203 and a transistor 204, and a second compensation circuit 209 including a transistor 205 and a transmission gate 206.

Each drain electrode of the transistor 201 and the transistor 202 in the inverter 207 is connected to an output terminal (OUT1) of the clocked inverter 212. A source electrode of transistor 201 is connected to a first power supply to which a power supply voltage VDD is supplied. A source electrode of the transistor 202 is connected to a second power supply to which a power supply voltage VSS is supplied. A gate electrode of the transistor 201 is connected to the second compensation circuit 209 while a gate electrode of the transistor 202 is connected to the first compensation circuit 208.

A signal A from the clocked inverter 212 used in a flip flop circuit of the previous stage is inputted to each gate electrode of the transistor 203 and the transistor 204 in the first compensation circuit 208. A signal A2 from an output terminal OUT1 of the stage before the previous stage is inputted to a source electrode of transistor 203. A source electrode of transistor 204 is connected to a second power supply to which the power supply voltage VSS is supplied. Each drain electrode of transistor 203 and the transistor 204 is connected to the gate electrode of the transistor 202.

A signal B from an output terminal OUT2 of a flip flop circuit of the subsequent stage is inputted to a gate electrode of the transistor 205 and a second control terminal of the transmission gate 206 in the second compensation circuit 209. A source electrode of transistor 205 is connected to a second power supply to which the power supply voltage VDD is supplied. An inverted signal Bb of the signal B from the output terminal OUT2 of the subsequent stage is inputted to a first control terminal of the transmission gate 206. A clock signal CK is inputted to an input terminal of the transmission gate 206. Note that the input terminal of the transmission gate 206 may be inputted with an inverted signal CKb of the clock signal CK depending on a stage of the flip flop circuit. A drain electrode of transistor 205 and an output terminal of the transmission gate 206 are connected to the gate electrode of the transistor 201.

The output terminal OUT1 of the clocked inverter 212 is connected to an input terminal of the inverter 210 and an output terminal of the clocked inverter 221. An output terminal of the inverter 210 and an input terminal of the clocked inverter 221 are connected to an output terminal OUT2 of the flip flop circuit.

The transmission gate 206 is used in the second compensation circuit 209, though the invention is not limited to this. Other switching elements such as a TFT may be used instead of the transmission gate. In either case, switching of the switching element is required to be controlled in synchronism with the signal B.

The signal A inputted to each gate electrode of the transistor 203 and the transistor 204 is not necessarily outputted from the OUT1 of the previous stage, but may be outputted from any terminal of the previous stage. The signal A2 inputted to the source electrode of the transistor 203 is not necessarily outputted from the OUT1 of the stage before the previous stage, but may be outputted from any terminal of the stage before the previous stage. The signal B inputted to the gate electrode of the transistor 205 and the second control terminal of the transmission gate 206 is not necessarily outputted from the OUT2 of the subsequent stage, but may be outputted from any terminal of the subsequent stage.

P-channel transistors are used for the transistor 201, the transistor 203 and the transistor 205, while N-channel transistors are used for the transistor 202 and the transistor 204.

The clocked inverter 221 has a third compensation circuit 222 including a transistor 224 and a transmission gate 225, and an inverter 223 including a transistor 226 and a transistor 227.

A gate electrode of the transistor 224 and a first control terminal of the transmission gate 225 in the clocked inverter 221 are connected to the output terminal OUT1 of the clocked inverter 212. A source electrode of transistor 226 is connected to a first power supply to which the power supply voltage VDD is supplied. Each source electrode of transistor 224 and the transistor 227 is connected to a second power supply to which the power supply voltage VSS is supplied. An inverted clock signal CKb is supplied to an input terminal of the transmission gate 225. An output terminal of the transmission gate 225 and a drain electrode of transistor 224 are connected to a gate electrode of the transistor 226. A gate electrode of the transistor 227 is connected to the output terminal OUT2 of the flip flop circuit. Each drain electrode of transistor 226 and the transistor 227 is connected to the output terminal OUT1 of the clocked inverter 212.

A P-channel transistor is used for the transistor 226, while N-channel transistors are used for the transistor 202, the transistor 224 and the transistor 227.

Figure 18B:
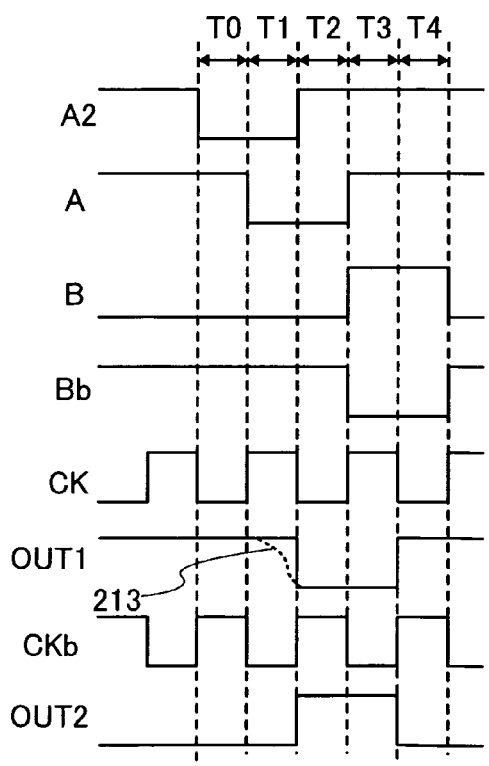

FIG. 18B shows a timing chart of the signals A, B, A2, and Bb, the clock signal CK, the signal outputted from the output terminal OUT1, and the signal outputted from the output terminal OUT2, which are shown in FIG. 18A.

As shown in the timing chart of FIG. 18B, in the flip flop circuit shown in FIG. 18A, what is called a fall timing at which the signal from the output terminal OUT1 varies from the power supply voltage VDD to the power supply voltage VSS is not determined by the clock signal CK but by the signal A2 from the output terminal OUT1 of the stage before the previous stage. Accordingly, when the transistor 202 is turned on in synchronism with the signal A2 from the output terminal OUT1 of the stage before the previous stage, the transistor 202 can be completely turned off during a period T1. Thus, it can be prevented that the signal falls early as shown by a dashed line 213.

It is preferable that the channel width W of the N-channel transistor in the clocked inverter 221, which supplies the power supply voltage VSS to the output terminal OUT1, be larger than that of the P-channel transistor 201 in the clocked inverter 212, which supplies the power supply voltage VDD to the output terminal OUT1. According to such a structure, during a period T3, the clocked inverter 221 can have higher capacity of current supply to the output terminal OUT1 than the clocked inverter 212; therefore, the output terminal OUT1 can be maintained at the power supply voltage VSS more correctly during the period T3.

Further in the flip flop circuit shown in FIG. 18A, input of the clock signal CK is controlled by the switching element (transmission gate 206) that operates in synchronism with the signal B. Thus, it is possible to reduce the load of wirings for supplying the clock signal CK to the flip flop circuit.

In general, a clocked inverter has two N-channel transistors connected in series and two P-channel transistors connected in series. When two transistors are connected in series, however, on-current tends to decrease. In order to increase the on-current, the two transistors connected in series are required to have a large channel width W. As a result, a transistor using the gate (gate capacitance) of the two transistors as load is also required to have a large channel width W, and thus the load of the whole clocked inverter increases, which prevents high frequency operation. According to the invention, however, it is not necessary to use a double gate transistor (two transistors connected in series) for controlling voltage supply to the output terminal of the clocked inverter, and a single gate transistor can be used instead. Accordingly, the transistor is not required to have a large channel width W and the size of the transistor can be made smaller, leading to high integration. In addition, since it is possible to reduce the load of the element using the gate of the transistors as load, the load of the whole clocked inverter can be reduced and high frequency operation is achieved. Further, capacity of current supply to the output terminal can be improved while reducing the channel width W. Accordingly, it can be prevented that the waveform of a signal outputted from the flip flop circuit becomes dull due to the load of the circuit of the subsequent stage.

Embodiment Mode 11

Described in this embodiment mode is a circuit diagram of a switch for inverting the potential of an anode and the potential of a cathode.

Figure 19A:
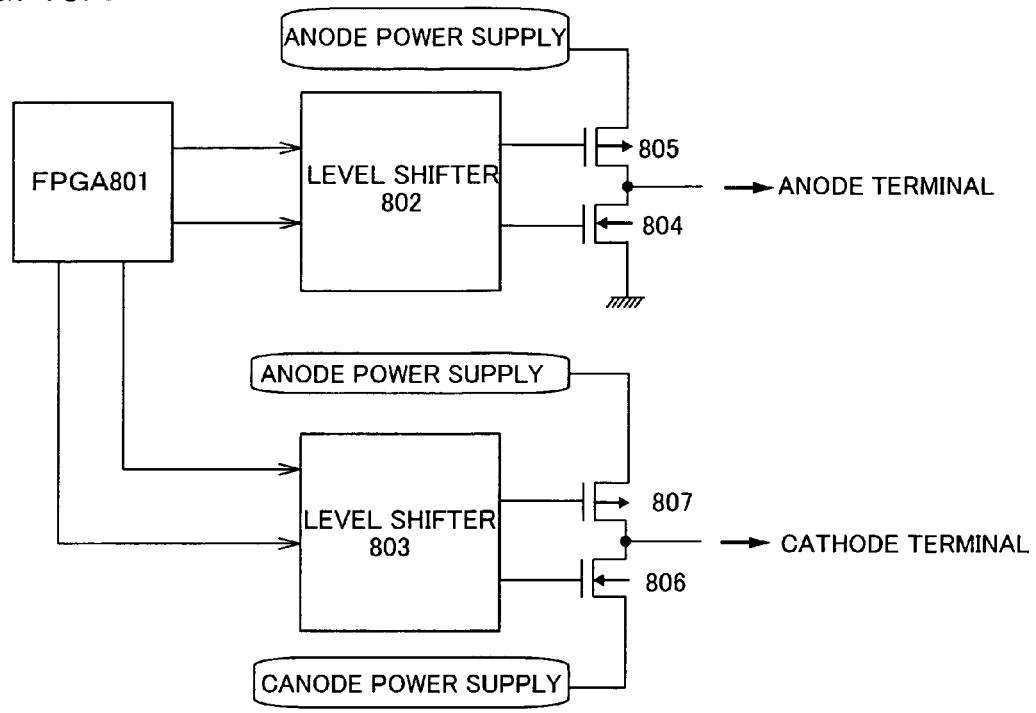
FIGS. 19A and 19B are diagrams each showing a driver circuit of the invention.

A switch shown in FIG. 19A includes a signal converting portion (FPGA: Field Programmable Logic Device) 801, and a plurality of level shifters 802 and 803 connected thereto. The level shifter 802 is connected to transistors 804 and 805 constituting an inverter, while the level shifter 803 is connected to transistors 806 and 807 constituting an inverter. P-channel transistors are used for the transistors 805 and 807, and N-channel transistors are used for the transistors 804 and 806. One electrode of the transistor 805 is connected to an anode power supply, one electrode of the transistor 804 is grounded, and an output terminal of the inverter including these transistors is connected to an anode terminal. One electrode of the transistor 807 is connected to an anode power supply, one electrode of the transistor 806 is connected to a cathode power supply, and an output terminal of the inverter including these transistors is connected to a cathode terminal.

Figure 19B:
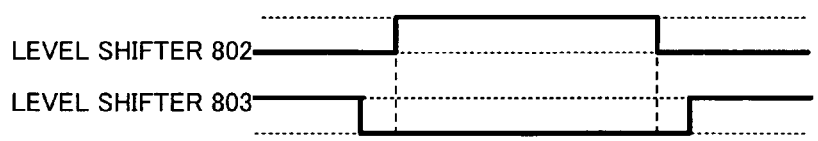

FIG. 19B shows a waveform of signals outputted from the level shifters 802 and 803. After the potential of the signal outputted from the level shifter 803 is inverted, the potential of the signal outputted from the level shifter 802 is inverted. Then, the potential of the signal outputted from the level shifter 802 returns to the initial value, and the potential of the signal outputted from the level shifter 803 returns to the initial value. When the potentials of the anode and the cathode are alternately inverted in this manner, a reverse bias voltage can be applied correctly.

When the invention is applied to such a switch circuit, the driving method capable of applying a reverse bias voltage correctly can be provided.

This application is based on Japanese Patent Application serial No. 2004-223024 filed in Japan Patent Office on Jul. 30, 2004, the entire contents of which are hereby incorporated by reference.

What is claimed is:

1. A light emitting device comprising:
   a light emitting element;
   a first transistor for driving the light emitting element;
   a second transistor for controlling the first transistor;
   a capacitor between the gate electrode and one electrode of the first transistor;
   a third transistor for discharging charges of the capacitor;
   a fourth transistor between the first transistor and the light emitting element;
   a unit for bringing a gate electrode of the first transistor into an electrically non-floating state by controlling the second transistor to be on-state in the case of applying a forward bias voltage to the light emitting element, after applying a reverse bias voltage to the light emitting element; and
   a unit for determining a potential of the gate electrode of the first transistor so that the light emitting element emits no light,
   wherein a gate electrode of the fourth transistor has a fixed potential.

2. The light emitting device according to claim 1, further comprising:
   an insulating film formed over one electrode of the first transistor,
   wherein one electrode of the light emitting element is connected through a contact hole formed in the insulating film.

3. The light emitting device according to claim 1, wherein one electrode of the light emitting element is formed over one electrode of the first transistor.

4. The light emitting device according to claim 1, wherein the first transistor and the second transistor have a crystalline semiconductor film.

5. The light emitting device according to claim 1, wherein the first transistor and the second transistor have an amorphous semiconductor film.

6. The light emitting device according to claim 1, wherein the first transistor has a gate electrode and a low concentration impurity region overlapping the gate electrode.

7. A driving method of a light emitting device comprising a light emitting element, a first transistor for driving the light emitting element, and a second transistor for controlling the first transistor, comprising the steps of:
   bringing a gate electrode of the first transistor into an electrically non-floating state by controlling the second transistor to be on-state in the case of applying a forward bias voltage to the light emitting element after applying a reverse bias voltage to the light emitting element; and
   determining a potential of the gate electrode of the first transistor so that the light emitting element emits no light,
   wherein a period during which all the scan lines are turned off is provided after a reverse bias voltage is applied to the light emitting element.

8. The driving method of a light emitting device, according to claim 7, wherein a period during which the reverse bias voltage is applied comprises a period during which all scan lines are turned on before the reverse bias voltage is applied.

9. The driving method of a light emitting device, according to claim 7, wherein an erasing period is provided before the period during which all the scan lines are turned on.

10. The driving method of a light emitting device, according to claim 7,
    wherein the period of applying a reverse bias voltage is provided in one frame period;
    the one frame period comprises m (m is a natural number of 2 or more) subframe periods SF1, SF2, . . . , SFm; and
    the m subframe periods comprise writing periods Ta1, Ta2, . . . , Tam and display periods Ts1, Ts2, . . . , Tsm respectively.

* * * * *